(12) United States Patent  (10) Patent No.: US 7,460,404 B1
Dong et al.  (45) Date of Patent: *Dec. 2, 2008

(54) BOOSTING FOR NON-VOLATILE STORAGE USING CHANNEL ISOLATION SWITCHING

(75) Inventors: Yingda Dong, Sunnyvale, CA (US); Jeffrey W. Lutze, San Jose, CA (US); Shih-Chung Lee, Yokohama (JP); Gerrit Jan Hemink, Yokohama (JP); Ken Oowada, Kanagawa (JP)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/745,082

(22) Filed: May 7, 2007

(51) Int. Cl.
*G11C 16/00* (2006.01)
(52) U.S. Cl. ............. 365/185.17; 365/185.18; 365/185.28
(58) Field of Classification Search ............. 365/185.02
See application file for complete search history.

(56) References Cited

U.S. PATENT DOCUMENTS

| | | |
|---|---|---|
| 5,075,890 A | 12/1991 | Itoh |
| 5,386,422 A | 1/1995 | Endoh |
| 5,522,580 A | 6/1996 | Varner, Jr. |
| 5,570,315 A | 10/1996 | Tanaka |
| 5,677,873 A | 10/1997 | Choi |
| 5,715,194 A | 2/1998 | Hu |
| 5,774,397 A | 6/1998 | Endoh |
| 5,991,202 A | 11/1999 | Derhocobian |
| 6,046,935 A | 4/2000 | Takeuchi |
| 6,049,494 A | 4/2000 | Sakui |
| 6,222,762 B1 | 4/2001 | Guterman |
| 6,295,227 B1 | 9/2001 | Sakui |
| 6,456,528 B1 | 9/2002 | Chen |
| 6,522,580 B2 | 2/2003 | Chen |
| 6,522,583 B2 | 2/2003 | Kanda |
| 6,859,395 B2 | 2/2005 | Matsunaga |
| 6,859,397 B2 | 2/2005 | Lutze |
| 6,975,537 B2 | 12/2005 | Lutze |
| 6,987,694 B2 | 1/2006 | Lee |
| 7,009,881 B2 | 3/2006 | Noguchi |
| 7,020,026 B2 | 3/2006 | Guterman |

(Continued)

OTHER PUBLICATIONS

U.S. Appl. No. 11/745,092, filed May 7, 2007.

(Continued)

*Primary Examiner*—Tan T. Nguyen
(74) *Attorney, Agent, or Firm*—Vierra Magen Marcus & DeNiro LLP

(57) ABSTRACT

Program disturb is reduced in non-volatile storage by preventing source side boosting in selected NAND strings. A self-boosting mode which includes an isolation word line is used. A channel area of an inhibited NAND string is boosted on a source side of the isolation word line before the channel is boosted on a drain side of the isolation word line. Further, storage elements near the isolation word line are kept in a conducting state during the source side boosting so that the source side channel is connected to the drain side channel. In this way, in selected NAND strings, source side boosting can not occur and thus program disturb due to source side boosting can be prevented. After the source side boosting, the source side channel is isolated from the drain side channel, and drain side boosting is performed.

33 Claims, 18 Drawing Sheets

U.S. PATENT DOCUMENTS

| | | |
|---|---|---|
| 7,023,737 B1 | 4/2006 | Wan |
| 7,046,568 B2 | 5/2006 | Cernea |
| 7,054,195 B2 | 5/2006 | Matsunaga |
| 7,088,621 B2 | 8/2006 | Guterman |
| 7,123,518 B2 | 10/2006 | Cheng |
| 7,161,833 B2 | 1/2007 | Hemink |
| 7,170,788 B1 | 1/2007 | Wan |
| 7,170,793 B2 | 1/2007 | Guterman |
| 7,184,308 B2 | 2/2007 | Kwon |
| 7,196,928 B2 | 3/2007 | Chen |
| 7,301,812 B2 * | 11/2007 | Guterman et al. ...... 365/185.18 |
| 7,304,894 B2 * | 12/2007 | Joo ........................ 365/185.28 |
| 2004/0057287 A1 | 3/2004 | Cernea |
| 2004/0109357 A1 | 6/2004 | Cernea |
| 2004/0255090 A1 | 12/2004 | Guterman |
| 2005/0024939 A1 | 2/2005 | Chen |
| 2006/0126390 A1 | 6/2006 | Gorobets |
| 2006/0140007 A1 | 6/2006 | Cernea |
| 2006/0140012 A1 | 6/2006 | Wan |
| 2006/0158947 A1 | 7/2006 | Chan |
| 2006/0164904 A1 | 7/2006 | Saleh |
| 2006/0198195 A1 | 9/2006 | Hemink |
| 2006/0203557 A1 | 9/2006 | Fukuda |
| 2006/0250850 A1 | 11/2006 | Lee |
| 2006/0279990 A1 | 12/2006 | Wan |
| 2007/0236992 A1 * | 10/2007 | Oowada ................. 365/185.02 |

OTHER PUBLICATIONS

International Search Report dated Jul. 8, 2008, PCT Appl. No. PCT/US2008/062432, filed May 2, 2008.

Written Opinion of the International Searching Authority, dated Jul. 8, 2008, PCT Appl. No. PCT/US2008/062432, filed May 2, 2008.

Notice of Allowance dated Sep. 8, 2008, U.S. Appl. No. 11/745,092, filed May 7, 2007.

* cited by examiner

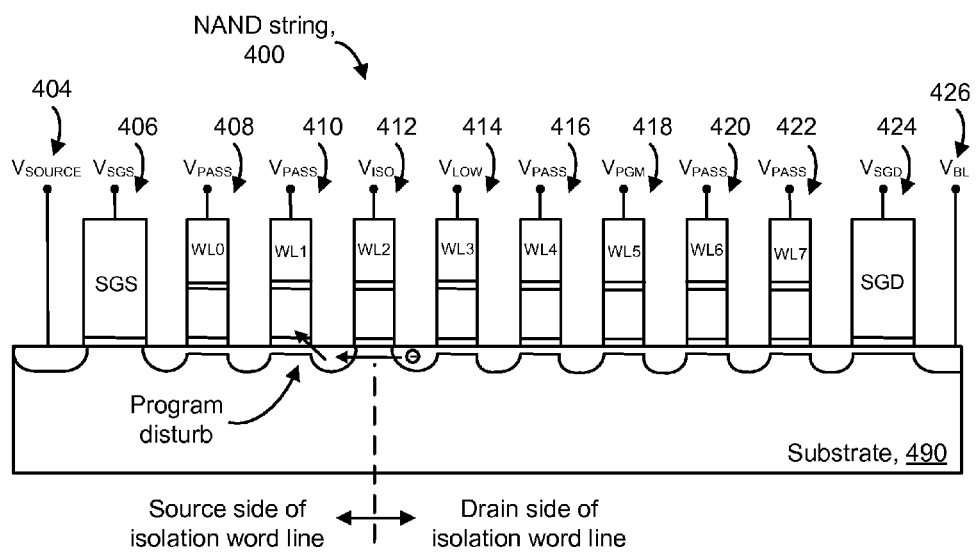

Fig. 5b

| | |
|---|---|
| $V_{SGD}$ | SGD |
| $V_{PASS}$ | WLn+1 through WLi |
| $V_{PGM}$ | WLn |
| $V_{LOW}$ | WLn-1 |
| $V_{ISO}$ | WLn-2 |
| $V_{PASS}$ | WL0 through WLn-3 |
| $V_{SGS}$ | SGS |

Fig. 5c

| | |
|---|---|
| $V_{SGD}$ | SGD |
| $V_{PASS}$ | WLn+1 through WLi |
| $V_{PGM}$ | WLn |
| $V_{PASS}$ | WLn-1 |
| $V_{LOW}$ | WLn-2 |
| $V_{ISO}$ | WLn-3 |
| $V_{PASS}$ | WL0 through WLn-4 |
| $V_{SGS}$ | SGS |

Fig. 5d

| | |
|---|---|
| $V_{SGD}$ | SGD |
| $V_{PASS}$ | WLn+1 through WLi |
| $V_{PGM}$ | WLn |
| $V_{PASS}$ | WLn-1 |
| $V_{LOW}$ | WLn-2 |
| $V_{ISO}$ | WLn-3 |
| $V_{LOW}$ | WLn-4 |
| $V_{PASS}$ | WL0 through WLn-5 |
| $V_{SGS}$ | SGS |

Fig. 5e

| | |
|---|---|
| $V_{SGD}$ | SGD |
| $V_{PASS}$ | WLn+1 through WLi |
| $V_{PGM}$ | WLn |
| $V_{PASS\text{-}HIGH}$ | WLn-1 |
| $V_{PASS\text{-}MEDIUM}$ | WLn-2 |
| $V_{PASS\text{-}LOW}$ | WLn-3 |
| $V_{LOW}$ | WLn-4 |
| $V_{ISO}$ | WLn-5 |
| $V_{LOW}$ | WLn-6 |
| $V_{PASS}$ | WL0 through WLn-7 |
| $V_{SGS}$ | SGS |

Fig. 5f

| | |
|---|---|
| $V_{SGD}$ | SGD |
| $V_{PASS}$ | WLn+1 through WLi |
| $V_{PGM}$ | WLn |
| $V_{PASS\text{-}HIGH}$ | WLn-1 |
| $V_{PASS\text{-}MEDIUM}$ | WLn-2 |
| $V_{PASS\text{-}LOW}$ | WLn-3 |
| $V_{LOW}$ | WLn-4 |
| $V_{ISO}$ | WLn-5 |
| $V_{LOW}$ | WLn-6 |
| $V_{PASS\text{-}LOW}$ | WLn-7 |
| $V_{PASS}$ | WL0 through WLn-8 |
| $V_{SGS}$ | SGS |

Fig. 5g

| | |
|---|---|
| $V_{SGD}$ | SGD |
| $V_{PASS}$ | WLn+2 through WLi |
| $V_{PASS\text{-}HIGH}$ | WLn+1 |
| $V_{PGM}$ | WLn |
| $V_{PASS\text{-}HIGH}$ | WLn-1 |
| $V_{PASS\text{-}MEDIUM}$ | WLn-2 |
| $V_{PASS\text{-}LOW}$ | WLn-3 |
| $V_{LOW}$ | WLn-4 |
| $V_{ISO}$ | WLn-5 |
| $V_{LOW}$ | WLn-6 |
| $V_{PASS\text{-}LOW}$ | WLn-7 |
| $V_{PASS}$ | WL0 through WLn-8 |
| $V_{SGS}$ | SGS |

Fig. 5h

| | |
|---|---|
| $V_{SGD}$ | SGD |
| $V_{PASS}$ | WLn+4 through WLi |
| $V_{ISO}$ | WLn+3 |
| $V_{PASS}$ | WLn+2 |
| $V_{PASS\text{-}HIGH}$ | WLn+1 |
| $V_{PGM}$ | WLn |
| $V_{PASS}$ | WLn-1 |
| $V_{LOW}$ | WLn-2 |
| $V_{ISO}$ | WLn-3 |
| $V_{PASS}$ | WL0 through WLn-4 |
| $V_{SGS}$ | SGS |

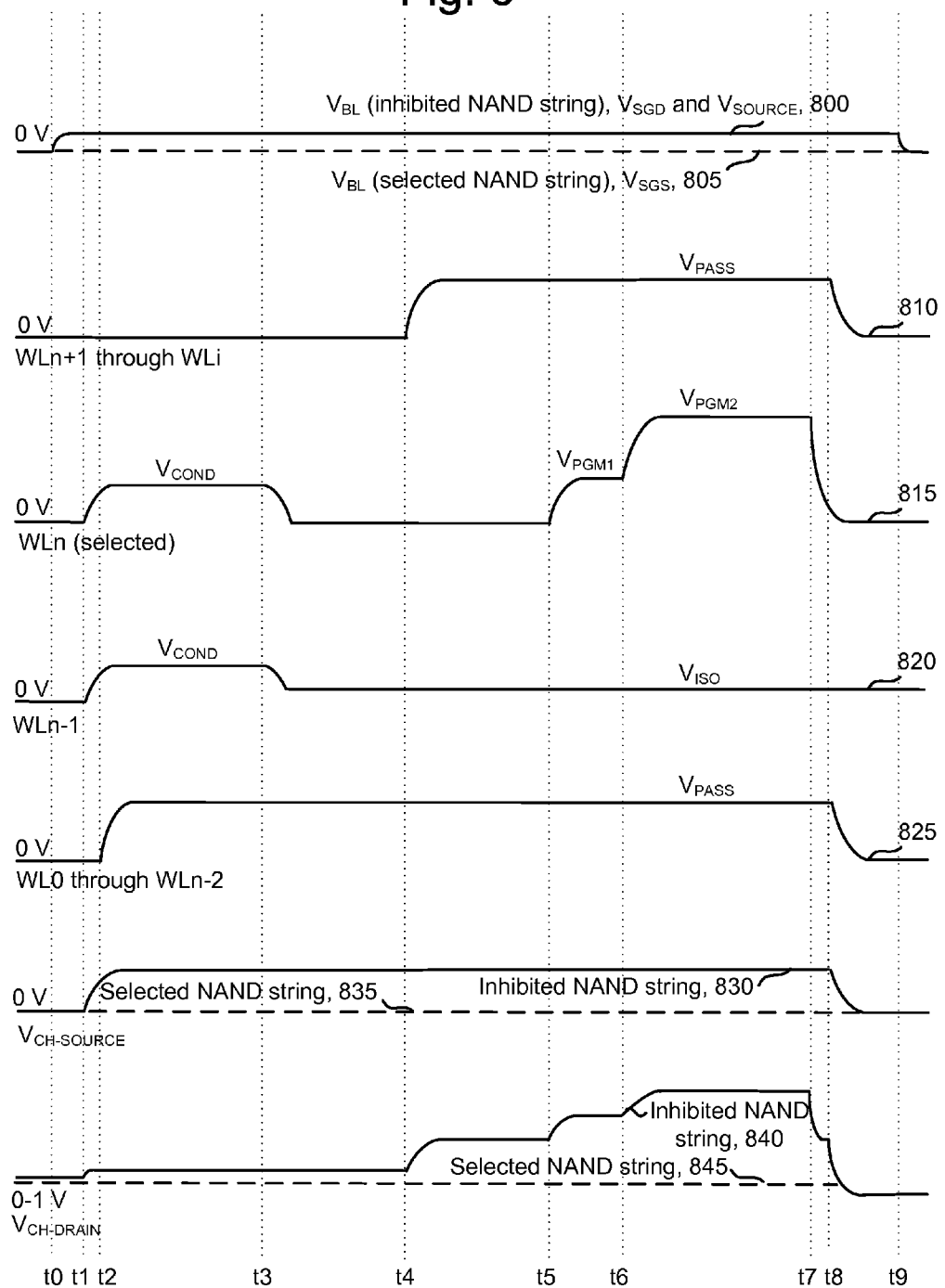

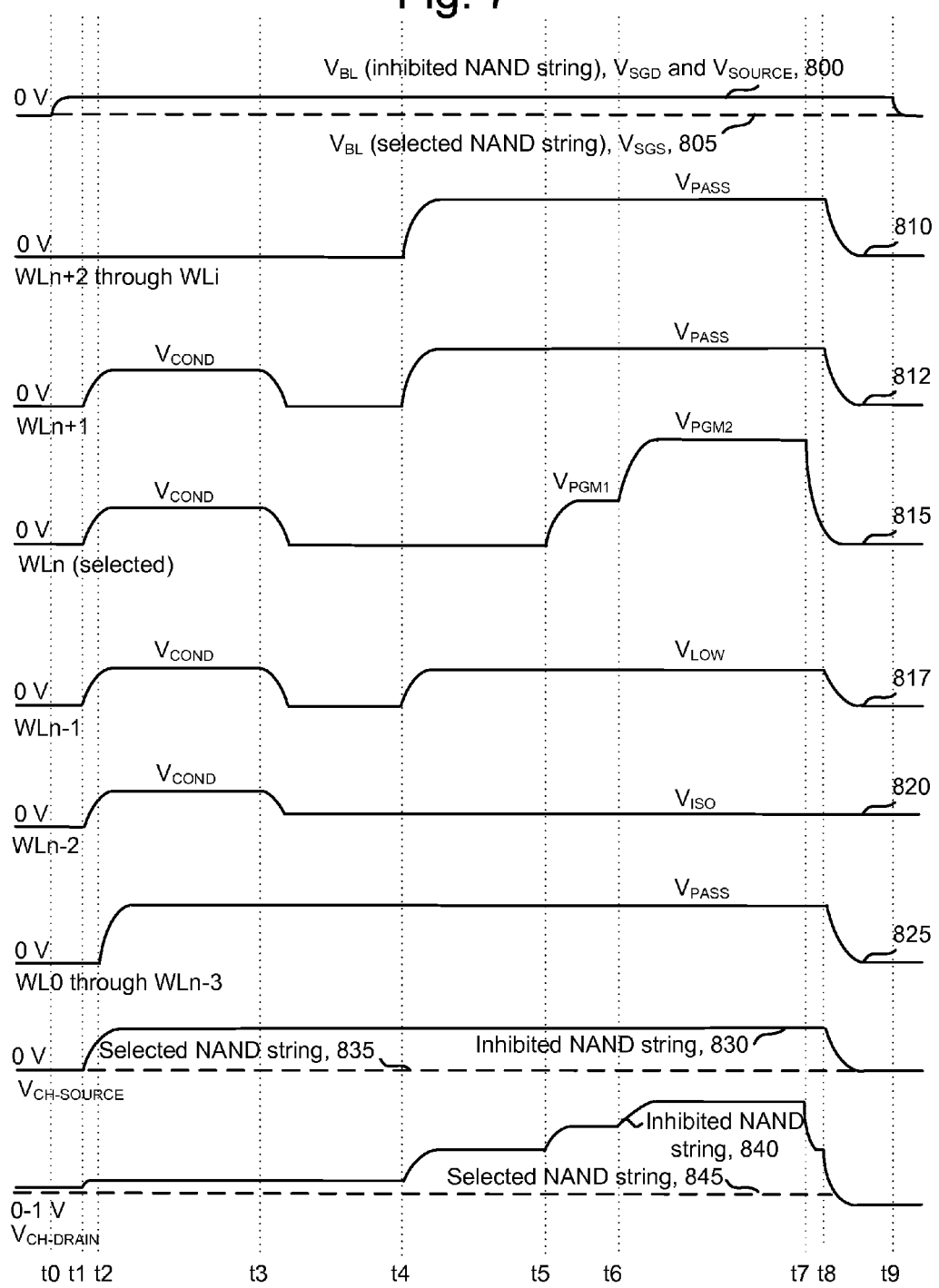

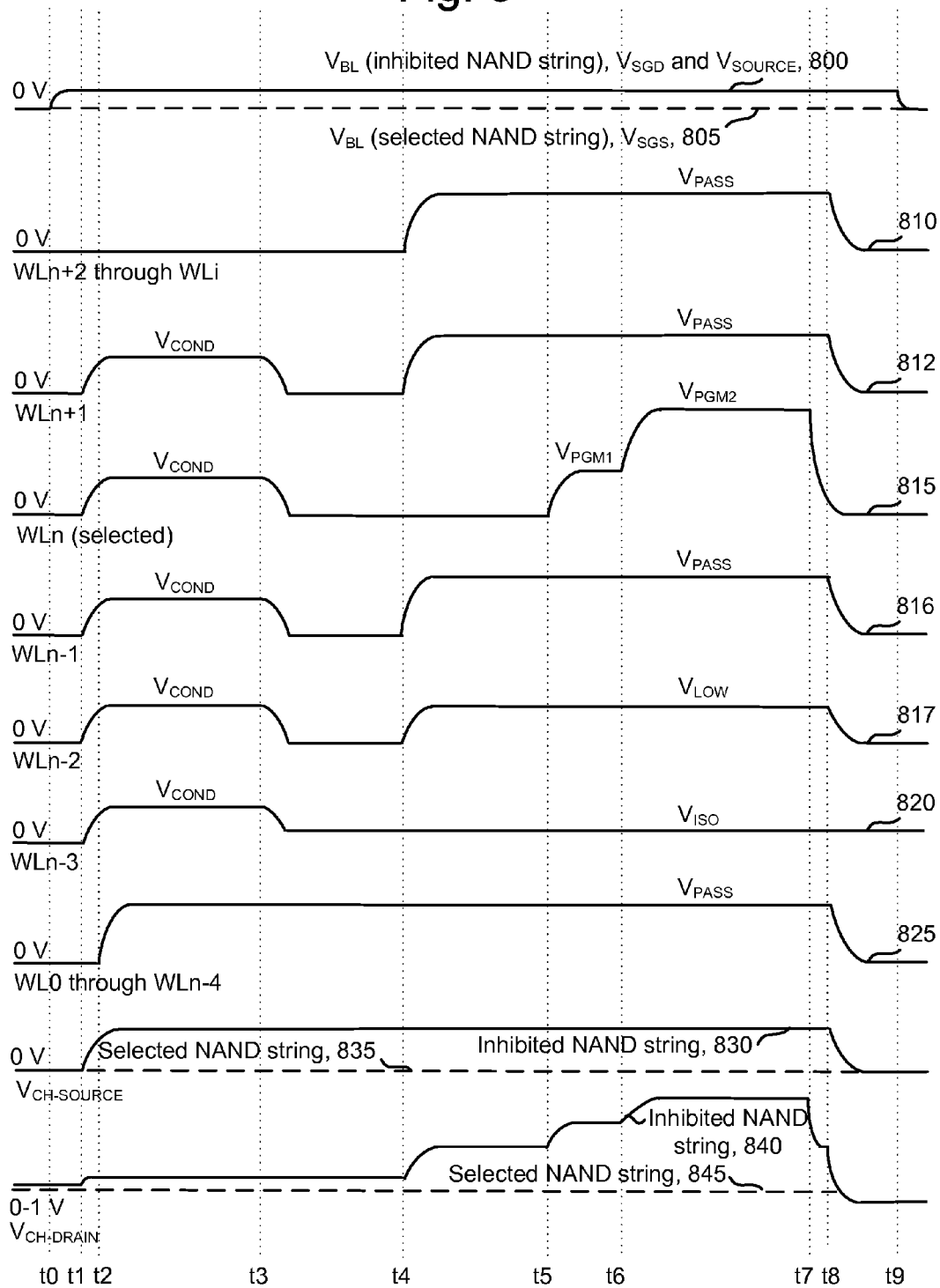

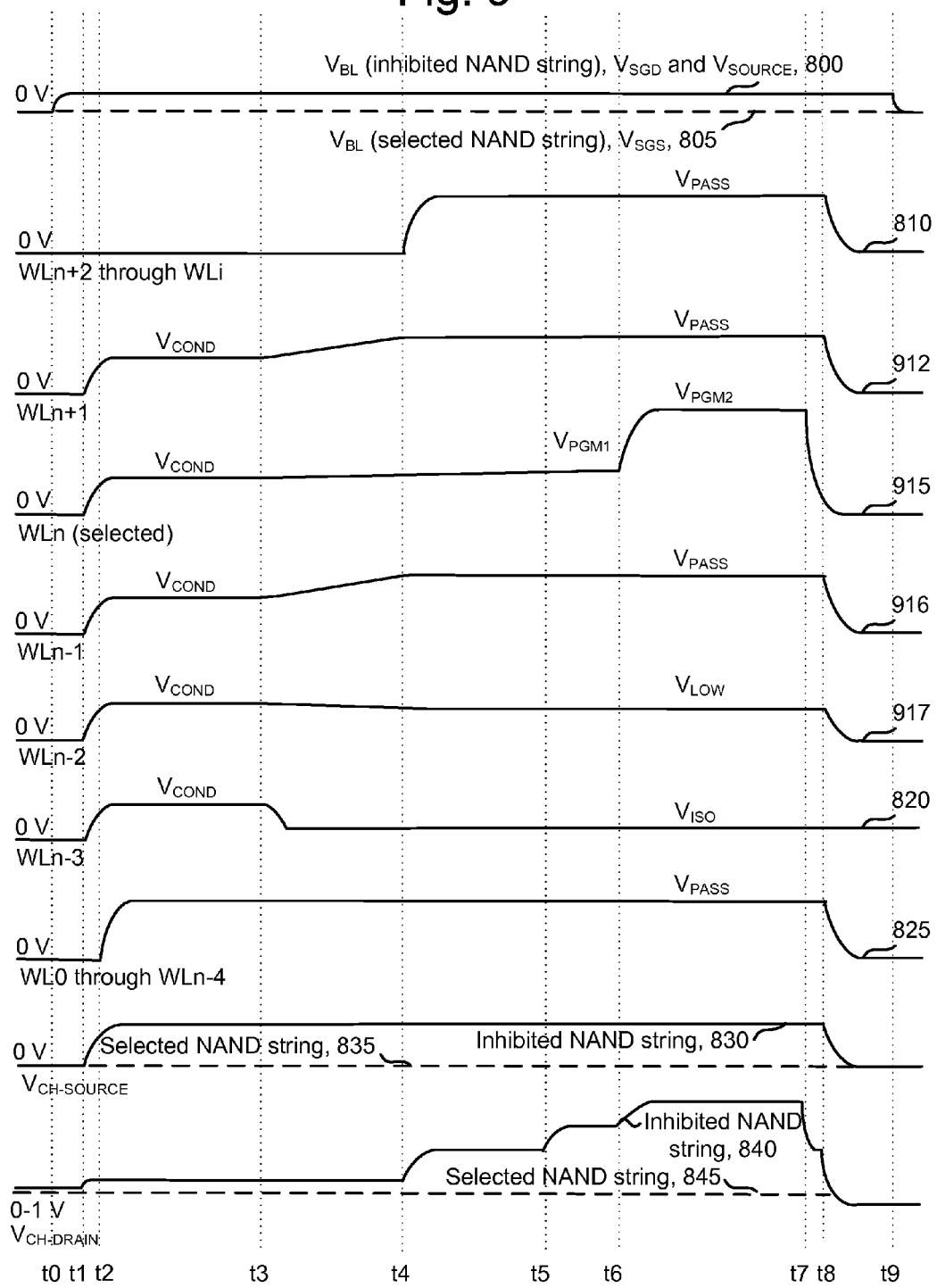

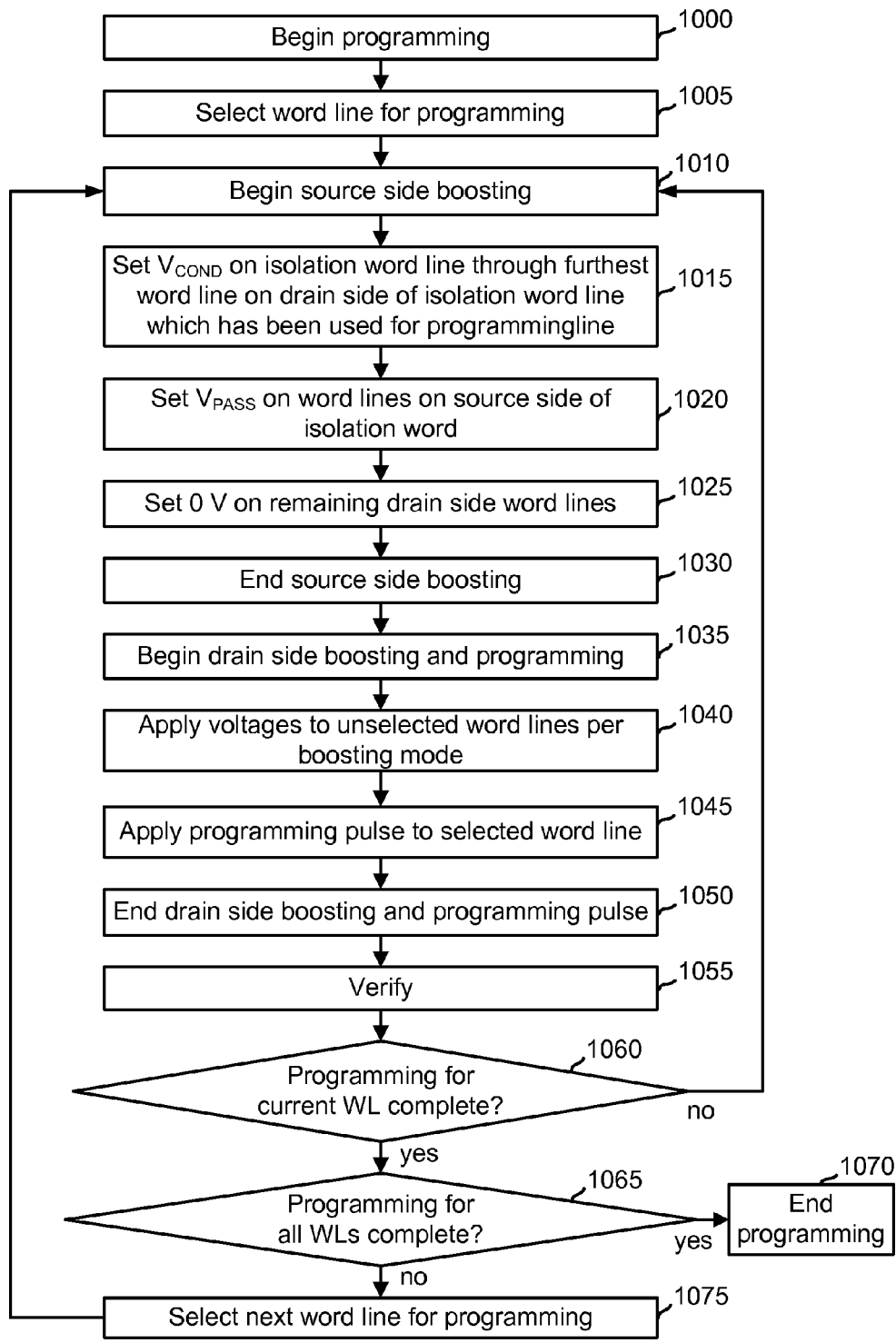

BOOSTING FOR NON-VOLATILE STORAGE USING CHANNEL ISOLATION SWITCHING

CROSS-REFERENCE TO RELATED APPLICATIONS

This application is related to co-pending, commonly assigned U.S. patent application Ser. No. 11/745,092, filed herewith on May 7, 2007, titled "Non-Volatile Storage With Boosting Using Channel Isolation Switching", incorporated herein by reference.

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," published Feb. 3, 2005; both of which are incorporated herein by reference in their entirety.

However, one issue which continues to be problematic is program disturb. Program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed.

SUMMARY OF THE INVENTION

The present invention addresses the above and other issues by providing a method for reducing program disturb in non-volatile storage.

In one embodiment, a method for operating non-volatile storage includes performing first boosting of at least one NAND string on a source side of a first word line before boosting the at least one NAND string on a drain side of a second word line, where the second word line is on a drain side of the first word line. A number of word lines including the first and second word lines are associated with the at least one NAND string, and the at least one NAND string has a number of non-volatile storage elements. The method further includes, during the first boosting, applying a voltage to the first word line for providing a first non-volatile storage element which is associated with the first word line in a conducting state, and applying a voltage to the second word line for providing a second non-volatile storage element which is associated with the second word line in a conducting state. The method further includes performing second boosting of the at least one NAND string on the drain side of the second word line, after the first boosting, while applying a voltage to the first word line for providing the first non-volatile storage element in a non-conducting state, and while applying a program voltage to the second word line. Thus, source side boosting occurs before applying the program pulse.

In another embodiment, a method for operating non-volatile storage includes performing first boosting of at least one NAND string on a side of a first non-volatile storage element in the at least one NAND string which is before the first non-volatile storage element in a programming sequence. The method further includes, during the first boosting, providing the first non-volatile storage element and a second non-volatile storage element in the at least one NAND string which is on a side of the first non-volatile storage element which is after the first non-volatile storage element in the programming sequence in a conducting state. The method further includes performing second boosting of the at least one NAND string, after the first boosting, on a side of the second non-volatile storage element which is after the second non-volatile storage element in the programming sequence while providing the first storage element in a non-conducting state.

In another embodiment, a method for operating non-volatile storage includes (a) in a first time period: (i) applying voltages to a first set of word lines on a source side of a particular word line in a set of word lines for boosting a first channel region of at least one NAND string, (ii) applying voltages to a second set of word lines which includes the particular word line, the second set of word lines is on a drain side of the first set of word lines, to provide non-volatile storage elements in the at least one NAND string which are associated with the second set of word lines in a conducting state, and (iii) applying voltages to a third set of word lines on a drain side of the second set of word lines, to avoiding boosting of a second channel region of the at least one NAND string. The method further includes (b) in a second time period which follows the first time period: (i) applying voltages to the third set of word lines for boosting the second channel region of the at least one NAND string, (ii) applying a program voltage to a word line in the second set of word lines, and (iii) applying a voltage to the particular word line to isolate the first channel region from the second channel region.

BRIEF DESCRIPTION OF THE DRAWINGS

FIG. 4 depicts a cross-sectional view of a NAND string showing a program disturb mechanism.

FIGS. 5a-h depict different examples of self-boosting modes.

FIG. 6 depicts a time line of word line and other voltages, based on the self-boosting mode of FIG. 5a.

FIG. 7 depicts a time line of word line and other voltages, based on the self-boosting mode of FIG. 5b.

FIG. 8 depicts a time line of word line and other voltages, based on the self-boosting mode of FIG. 5c.

FIG. 9 depicts a time line of word line and other voltages, as an alternative to the time line of FIG. 8.

FIG. 10 depicts a programming process in which a source side of a NAND string is boosted before a drain side of the NAND string.

DETAILED DESCRIPTION

The present invention provides a method for reducing program disturb in non-volatile storage.

Figure 1:
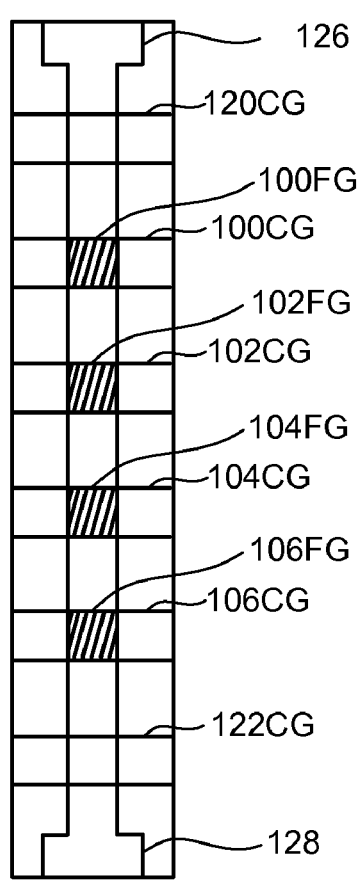
FIG. 1 is a top view of a NAND string.
Figure 2:
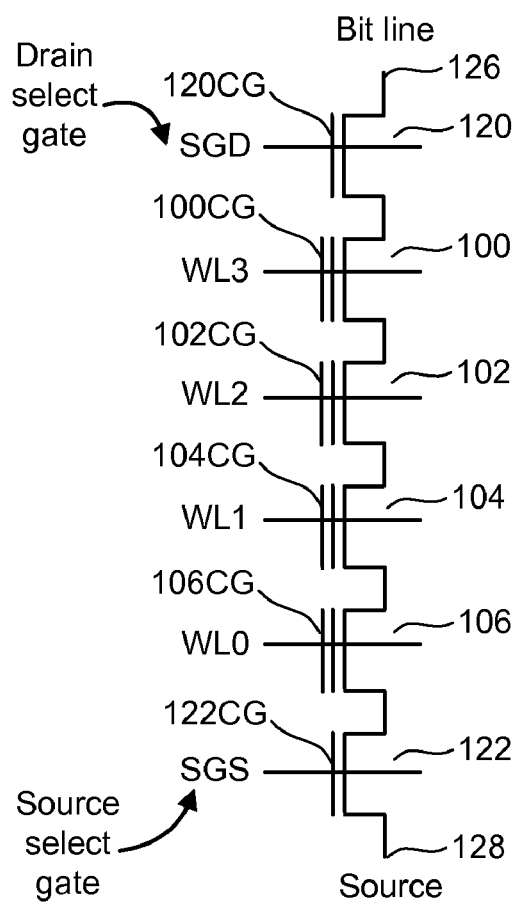
FIG. 2 is an equivalent circuit diagram of the NAND string of FIG. 1.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD. Select gate 122 is connected to select line SGS.

Figure 3:
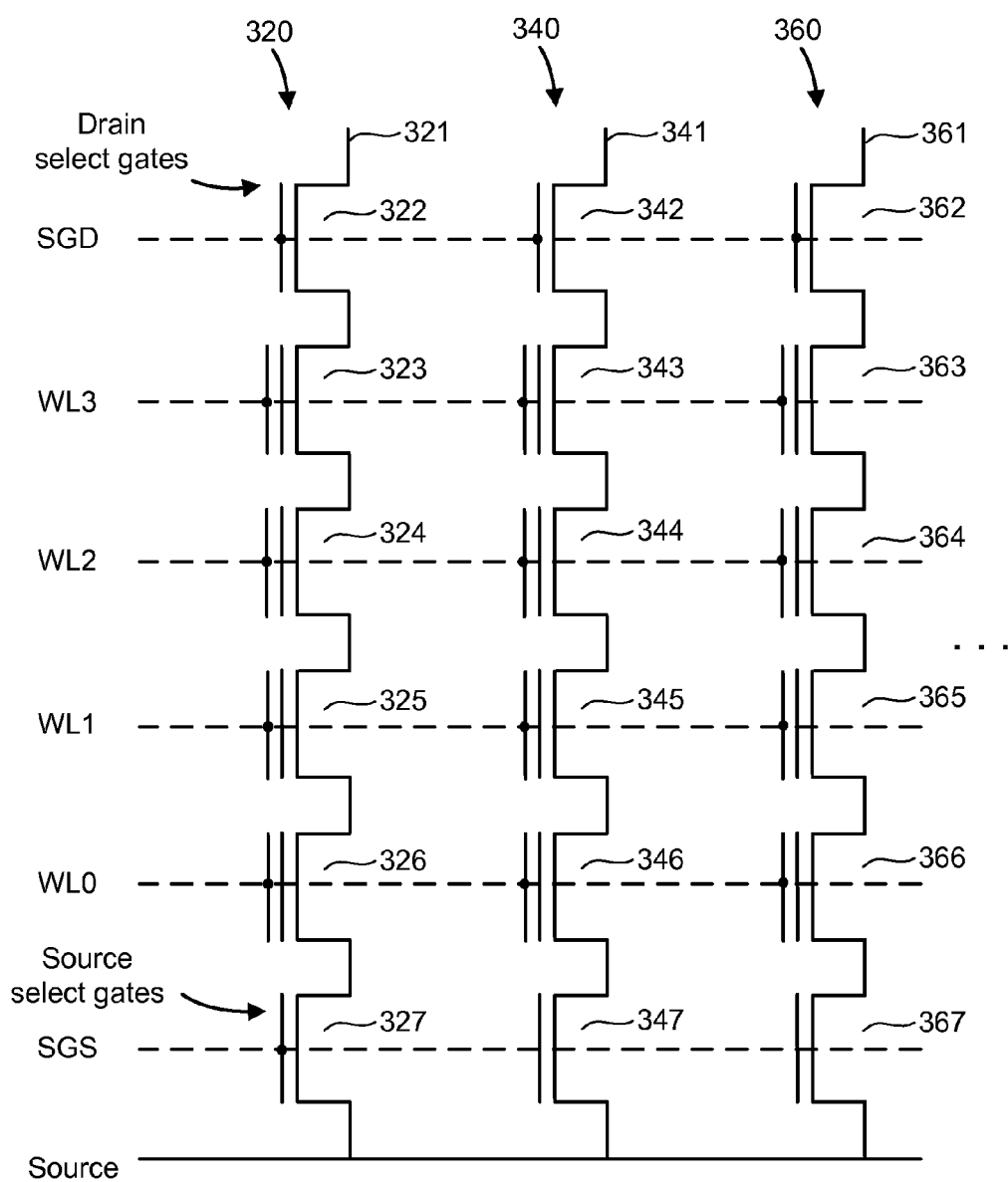
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Pub. 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,522,580, 5,570,315, 5,774,397, 6,046,935, 6,456,528 and 6,522,580, each of which is incorporated herein by reference.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

However, program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed. Various program disturb mechanisms can limit the available operating window for non-volatile storage devices such as NAND flash memory.

For example, if NAND string 320 is inhibited (e.g., it is an unselected NAND string which does not contain a storage element which is currently being programmed) and NAND string 340 is being programmed (e.g., it is a selected NAND string which contains a storage element which is currently being programmed), program disturb can occur at NAND string 320. For example, if a pass voltage, $V_{PASS}$, is low, the channel of the inhibited NAND string is not well boosted, and a selected word line of the unselected NAND string can be unintentionally programmed. In another possible scenario, the boosted voltage can be lowered by Gate Induced Drain Leakage (GIDL) or other leakage mechanisms, resulting in the same problem. Other effects, such as shifts in the $V_{TH}$ of a charge storage element due to capacitive coupling with other neighboring storage elements that are programmed later, can also contribute to program disturb.

FIG. 4 depicts a cross-sectional view of a NAND string showing a program disturb mechanism. Here, a revised erased area self-boosting (REASB) mode, such as depicted in FIG. 5c, is used. The view is simplified and not to scale. The NAND string 400 includes a source-side select gate 406, a drain-side select gate 424, and eight storage elements 408, 410, 412, 414, 416, 418, 420 and 422, formed on a substrate 490. The components can be formed on a p-well region which itself is formed in an n-well region of the substrate. The n-well can in turn be formed in a p-substrate. A source supply line 404 with a potential of $V_{SOURCE}$ is provided in addition to a bit line 426 with a potential of $V_{BL}$. During programming, $V_{PGM}$ is provided on a selected word line, in this case, WL5, which is associated with a selected storage element 418. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. In one example boosting mode, when storage element 418 is the selected storage element, a relatively low voltage, $V_{LOW}$, e.g., 2-6 V, is applied to a neighboring source-side word line (WL3), while an isolation voltage, $V_{ISO}$, e.g., 0-4 V, is applied to another source-side word line (WL2), referred to as an isolation word line and $V_{PASS}$ is applied to the remaining word lines associated with NAND string 400 (i.e., WL0, WL1, WL4, WL6 and WL7). While the absolute values of $V_{ISO}$ and $V_{LOW}$ may vary over a relatively large and partly overlapping range, $V_{ISO}$ is always lower in value than $V_{LOW}$, in one possible implementation. $V_{SGS}$ is applied to the select gate 406 and $V_{SGD}$ is applied to the select gate 424. The source side of a word line or non-volatile storage element refers to the side which faces the source end of the NAND string, e.g., at source supply line 404, while the drain side of a word line or non-volatile storage element refers to the side which faces the drain end of the NAND string, e.g., at bit line 426.

FIGS. 5a-h depict different examples of self-boosting modes. Note that the voltages depicted indicate the voltages used during the drain side boosting which occurs after source side boosting. See also FIGS. 6-9. Various other approaches can be used as well. Generally, various types of boosting modes have been developed to combat program disturb. During programming of storage elements on a selected word line, the boosting modes can be implemented by applying a set of voltages to unselected word lines which are in communication with storage elements which are not currently being programmed. The storage elements which are being programmed are associated with selected NAND strings while other storage elements are associated with unselected NAND strings.

In the examples provided, the word lines are WL0 through WLi, the selected word line is WLn, the source-side select gate control line is SGS and the drain-side select gate control line is SGD. A set of voltages which is applied to the control lines is also depicted. Programming can proceed in a programming sequence one word line at a time, from the source side to the drain side of a NAND string. However, other programming sequences can be used as well. For example, in a two-step programming technique, the storage elements of a NAND string may be partially programmed in a first pass which proceeds one word line at a time from the source side to the drain side of a NAND string. The programming is then completed in a second pass which also proceeds one word line at a time from the source side to the drain side of a NAND string. In another option, the storage elements are programmed in a two up, one down process, e.g., in the sequence: WL0 (partial programming), WL1 (partial programming), WL0 (completion of programming), WL2 (partial programming), WL1 (completion programming), WL3 (partial programming), and so forth.

In the example shown in FIG. 5a, the voltages which are applied include $V_{SGS}$, which is applied to the source-side select gate control line SGS, a pass voltage, $V_{PASS}$, which is applied to each of the unselected word lines, WL0 through WLn−2 and WLn+1 through WLi, a program voltage, $V_{PGM}$, which is applied to the selected word line WLn, an isolation voltage $V_{ISO}$ which is applied to WLn−1, the word line which is adjacent to the selected word line on the source side, and $V_{SGD}$, which is applied via the drain-side select gate control line SGD. Typically, $V_{SGS}$ is 0 V so that the source-side select gate is off, an additional source bias voltage $V_{SOURCE}$ in a range of 0.5-1.5 V may be applied to further improve the cut-off behavior of the source-side select gate. $V_{SGD}$ is about 1.5-3 V so that the drain-side select gate is on for the selected NAND strings, due to application of a corresponding low bit line voltage $V_{BL}$ such as 0-1V. The drain-side select gate is off for the unselected/inhibited NAND strings, due to application of a corresponding higher $V_{BL}$ such as 1.5-3 V. A low isolation voltage $V_{ISO}$, in a typical range of 0-4 V, is applied to the word line which is adjacent to the selected word line on the source side, in the example of FIG. 5a.

Additionally, $V_{PASS}$ can be about 7-10 V and $V_{PGM}$ can vary from about 12-25 V. In one programming scheme, a pulse train of program voltages is applied to the selected word line. See FIG. 20. The amplitude of each successive program pulse in the pulse train increases in a staircase manner, typically by about 0.3-0.5 V per pulse. Further, verify pulses can be applied between program pulses to verify whether the selected storage elements have reached a target programming condition. Note also that each individual program pulse can have a fixed amplitude, or can have a varying amplitude. For example, some programming schemes apply a pulse with an amplitude which varies like a ramp or staircase. Any type of program pulse can be used.

With WLn as the word line being programmed, and programming proceeding from the source side to the drain side of each NAND string, the storage elements associated with WL0 through WLn−1 will have already been at least partially programmed, since the last erase operation, and the storage elements associated with WLn+1 through WLi will be erased or at least not yet fully programmed when the storage elements on WLn are being programmed. The pass voltages on the unselected word lines couple to the channels associated with the unselected NAND strings, causing a voltage to exist in the channels of the unselected NAND strings which tends to reduce program disturb by lowering the voltage across the tunnel oxide of the storage elements.

FIG. 5b depicts a revised erased area self-boosting mode. In this case, an isolation voltage, $V_{ISO}$, is applied to WLn−2, and a low voltage, $V_{LOW}$, which is between $V_{ISO}$ and $V_{PASS}$, is applied to WLn−1. $V_{LOW}$ can also be considered to be an isolation voltage, however, $V_{LOW}$ is always higher than $V_{ISO}$ and lower than $V_{PASS}$, in one possible implementation. In this approach, $V_{LOW}$ serves as an intermediate voltage so that there are less abrupt voltage changes in the channel between the selected word line (WLn) and the adjacent source side word lines (WLn−1 and WLn−2). For example, $V_{LOW}$ may be, e.g., 2-6 V and $V_{ISO}$ may be, e.g., 0-4 V. The less abrupt change in channel voltage results in a lower electric field in the channel region and a lower channel potential, especially at the storage elements associated with the $V_{ISO}$ word line. A high channel voltage at the drain or source side of the storage elements associated with the $V_{ISO}$ word line (as in FIG. 5a) may cause charge carriers (electrons and holes) to be generated by Gate Induced Drain Leakage (GIDL). The electrons that are generated by GIDL may subsequently be accelerated in the strong electric field in the area in between the selected word line and the $V_{ISO}$ word line and may subsequently be injected (via hot electron injection) in some of the storage elements associated with the selected word line and thus causing program disturb. This program disturb mechanism can be avoided or reduced by reducing the electric field, such as by adding one (or more) word lines that are biased with an intermediate voltage in between the voltage of the selected word line and $V_{ISO}$.

The remaining unselected word lines receive $V_{PASS}$. Specifically, $V_{PASS}$ is applied to a first group of storage elements associated with WL0 through WLn−3, where the first group is adjacent to the source side select gate, and on a source side of the isolation word line WLn−2. Also, $V_{PASS}$ is applied to a second group of storage elements associated with WLn+1 through WLi, where the second group is adjacent to the drain side select gate, and on a drain side of the selected word line WLn.

FIG. 5c depicts another revised erased area self-boosting mode. In this case, the source-side word line (WLn−1) adjacent to the selected word line (WLn) receives $V_{PASS}$, the next word line (WLn−2) receives $V_{LOW}$ and the next word line after that (WLn−3) receives $V_{ISO}$. The remaining unselected word lines receive $V_{PASS}$. This boosting mode is also discussed in connection with FIG. 4. Specifically, $V_{PASS}$ is applied to a first group of storage elements associated with WL0 through WLn−4, where the first group is adjacent to the source side select gate, and on a source side of the isolation word line WLn−3. Also, $V_{PASS}$ is applied to a second group of storage elements associated with WLn+1 through WLi, where the second group is adjacent to the drain side select gate, and on a drain side of the selected word line WLn. An advantage of this approach is that the selected word line, which is most sensitive to program disturb because of the high program voltage $V_{PGM}$ that is applied to that word line, is further away from the $V_{ISO}$ and $V_{LOW}$ word lines. Storage elements associated with the selected word line are less likely to be disturbed by hot electron injection as the electric field that is responsible for creating the hot carriers is located further away from the selected word line.

FIG. 5d depicts another revised erased area self-boosting mode. In this case, the source-side word line (WLn−1) adjacent to the selected word line (WLn) receives $V_{PASS}$, the next word line (WLn−2) receives $V_{LOW}$, the next word line (WLn−3) receives $V_{ISO}$, and the next word line receives $V_{LOW}$. The remaining unselected word lines receive $V_{PASS}$. Specifically, $V_{PASS}$ is applied to a first group of storage elements associated with WL0 through WLn−5, where the first group is adjacent to the source side select gate, and on a source side of the isolation word line WLn−3. Also, $V_{PASS}$ is applied to a second group of storage elements associated with WLn+1 through WLi, where the second group is adjacent to the drain side select gate, and on a drain side of the selected word line WLn. Providing $V_{LOW}$ at both sides of the isolation word line can reduce the probability that GIDL occurs at the isolation word line due to a highly boosted source side, e.g., at a portion of the channel which is associated with WL0 through WL5.

FIG. 5e depicts another revised erased area self-boosting mode. In this case, the source-side word line (WLn−1) adjacent to the selected word line (WLn) receives $V_{PASS-HIGH}$, the next word line (WLn−2) receives $V_{PASS-MEDIUM}$, the next word line (WLn−3) receives $V_{PASS-LOW}$, the next word line (WLn−4) receives $V_{LOW}$, the next word line (WLn−5) receives $V_{ISO}$ and the next word line (WLn−6) receives $V_{LOW}$. The remaining unselected word lines receive $V_{PASS}$. Specifically, $V_{PASS}$ is applied to a first group of storage elements associated with WL0 through WLn−7, where the first group is adjacent to the source side select gate, and on a source side of the isolation word line WLn−5. Also, $V_{PASS}$ is applied to a second group of storage elements associated with WLn+1 through WLi, where the second group is adjacent to the drain side select gate, and on a drain side of the selected word line WLn.

Thus, multiple $V_{PASS}$ voltages can be used at the same time. For example, different $V_{PASS}$ values can be used for the drain and source sides of the NAND string. Further, multiple $V_{PASS}$ voltages can be used at both the drain and source sides. For instance, a higher $V_{PASS}$, $V_{PASS-HIGH}$, can be used next to the selected word line for programming, as depicted. For the word lines in between the selected word line and the isolation word line, we can have multiple word lines that are biased to different $V_{PASS}$ values, e.g., $V_{PASS-LOW}$, $V_{PASS-MEDIUM}$ and $V_{PASS-HIGH}$. In one implementation, $V_{PGM}$>$V_{PASS-HIGH}$>$V_{PASS-MEDIUM}$>$V_{PASS-LOW}$>$V_{LOW}$>$V_{ISO}$. Note that multiple values of $V_{LOW}$ and $V_{ISO}$ are also possible. Generally, all $V_{ISO}$ voltages are less than all $V_{LOW}$ voltages, which in turn are less than all $V_{PASS}$ voltages. By increasing the number of word lines in between the selected word line and the $V_{ISO}$ word line, and by gradually reducing the bias voltage on those word lines, the electric field in between the selected word line and the $V_{ISO}$ word line can be reduced and thus program disturb can be reduced.

FIG. 5f depicts another revised erased area self-boosting mode. In this case, the source-side word line (WLn−1) adjacent to the selected word line (WLn) receives $V_{PASS-HIGH}$, the next word line (WLn−2) receives $V_{PASS-MEDIUM}$, the next word line (WLn−3) receives $V_{PASS-LOW}$, the next word line (WLn−4) receives $V_{LOW}$, the next word line (WLn−5) receives $V_{ISO}$, the next word line (WLn−6) receives $V_{LOW}$, and the next word line (WLn−7) receives $V_{PASS-LOW}$. The remaining unselected word lines receive $V_{PASS}$. Specifically, $V_{PASS}$ is applied to a first group of storage elements associated with WL0 through WLn−8, where the first group is adjacent to the source side select gate, and on a source side of the isolation word line WLn−5. Also, $V_{PASS}$ is applied to a second group of storage elements associated with WLn+1 through WLi, where the second group is adjacent to the drain side select gate, and on a drain side of the selected word line WLn.

FIG. 5g depicts another revised erased area self-boosting mode. This case differs from that of FIG. 5f in that the drain-side word line (WLn+1) adjacent to the selected word line (WLn) receives $V_{PASS-HIGH}$ instead of $V_{PASS}$.

FIG. 5h depicts another revised erased area self-boosting mode. In this case, an additional isolation word line is provided on the drain side of the programmed word line. For example, compared to the boosting mode of FIG. 5c, WLn+1 receives $V_{PASS-HIGH}$ and WLn+3 receives $V_{ISO}$, in one possible implementation. WLn+2 receives $V_{PASS}$, where $V_{PASS-HIGH}$>$V_{PASS}$. As a result of applying the boosting voltages and the two isolation voltages, three boosted channel areas are provided in the NAND string. For example, a first boosted channel area is in the region of WL0 through WLn−4, a second boosted channel area is in the region of WLn−1 through WLn+2, and a third boosted channel area is in the region of WLn+4 through WLi. The use of $V_{PASS-HIGH}$ removes the data dependency on WLn+1, such as when WLn+1 may be partially programmed with lower page data (see, e.g., the B' state of FIG. 18b). The boosting modes of FIGS. 5d-g can be modified similarly.

Various other implementations are possible. For example, the different boosted channel areas can be boosted to different levels. Also, the number of word lines between the selected word line and the additional drain side isolation word line can vary, as can the voltages applied to the unselected word lines in the different boosted channel areas. Implementations with more than two isolation voltages and three boosted channel areas can also be provided. For further details, refer to U.S. patent application Ser. No. 11/535,628, filed Sep. 27, 2006, entitled "Reducing Program Disturb In Non-Volatile Storage", incorporated herein by reference.

Regarding timing of the boosting of the different channel regions, various implementations are possible. Consider a first channel region between WL0 and WLn−4, a second channel region between WLn−1 and WLn+2 and a third channel region between WLn+4 and WLi. In one approach, the first and third channel regions are boosted together, after which the second channel region is boosted. In one approach, the first channel region is boosted, after which the second and third channel regions are boosted together. In one approach, the first channel region is boosted, after which the third channel region is boosted, after which the second channel region is boosted. Generally, the second channel region should preferably not be boosted before the third channel region because electrons from the third channel region would be attracted to the boosted second channel region, thus lowering the boosted channel potential in the second channel region while slightly boosting the third channel region. This is an undesired effect as the reduced boosting may cause program disturb.

Note that all the above examples serve as illustrations only, as other bias conditions and different combinations of bias conditions are possible.

Referring again to FIG. 4, assuming programming of storage elements along the NAND string 400 progresses in a programming sequence from storage element 408 to storage element 422, storage elements 408-416 will already have been at least partially programmed, and storage elements 420 and 422 will not yet have been fully programmed. Thus, all or some of storage elements 408-416 will have electrons programmed into and stored in their respective floating gates, and storage elements 420 and 422 can be erased or partially programmed, depending on the programming mode. For example, the storage elements 420 and 422 may be partially programmed when they have been previously programmed in the first step of a two-step programming technique.

With the EASB or REASB boosting modes, $V_{ISO}$ is applied to one or more source-side neighbors of the selected word line at some point after boosting is initiated, and is sufficiently low to isolate programmed and erased channel areas in the substrate. That is, a channel area of the substrate 490 on a source-side of the isolation word line 412 is isolated from a channel area of the substrate on a drain-side of the isolation word line 412. The source side can also be considered to be a programmed side since most or all of the associated storage elements have been programmed, while the drain side can also be considered to be an unprogrammed side since the associated storage elements have not yet been programmed. Further, the channel area on the source side is a first boosted region of the substrate 490 which is boosted by the application of $V_{PASS}$ on WL0 and WL1, while the channel area on the drain side is a second boosted region of the substrate 490 which is boosted mainly by the application of $V_{PGM}$ on WL5 and $V_{PASS}$ on WL4, WL6 and WL7.

The programmed area is in general boosted less because the channel potential under a programmed storage element can only start to increase (e.g. be boosted) after $V_{PASS}$ reaches a sufficiently high level to turn on the programmed storage element. On the other hand, the channel potential of storage elements in the erased condition will start to increase (almost) immediately after $V_{PASS}$ is applied as most (if not all) of the erased storage elements will be in a turned on state even when the $V_{PASS}$ voltage that is applied to their corresponding word lines is still very low (during the ramping up of the $V_{PASS}$ voltage). Thus, the channel area on the drain side of the isolation word line will be boosted to a higher potential than the channel area at the source side of the isolation word line as both areas are isolated from one another. In some embodiments, the programming voltage $V_{PGM}$ that is applied to the selected word line will be applied after both channel areas are sufficiently boosted.

While the above embodiments can reduce certain program disturb mechanisms, other program disturb mechanisms do exist. One other program disturb fail mode tends to happen on higher word lines when $V_{PASS}$ is relatively high. This fail mode occurs on the NAND strings that are being programmed (e.g., selected NAND strings), and is cause by hot carrier injection from the drain side in the selected NAND string channels. This hot carrier injection is induced by a high boosting potential in the source side channel when $V_{PASS}$ reaches a certain level. In particular, with EASB and REASB, as discussed, the NAND string is separated into a source side and a drain side, by applying the isolation voltage $V_{ISO}$ on a word line below the selected word line. In the selected NAND string, the drain side channel potential will stay at 0-1 V, for instance, during boosting. But, on the source side, because the storage element which receives $V_{ISO}$ is cut off, e.g., provided in a non-conductive state, assuming $V_{ISO} < V_{TH}$, where $V_{TH}$ is the threshold voltage of the storage element, the channel is still boosted up. When the source side boosting potential becomes high and the drain side channel potential remains at 0-1 V, a large lateral electric field is created which can induce hot carrier injection to the storage elements on the source side and cause program disturb fails. This is depicted in FIG. 4, where the arrows depict electrons moving across the channel under the isolation storage element 412 and into the floating gate of storage element 410, raising the threshold voltage of the storage element.

To prevent this kind of program disturb in a selected NAND string, it is better not to isolate the source side channel from the drain side channel during boosting. However, without isolation, in the inhibited NAND string channels, the drain side boosting will be significantly lowered by the source side programmed storage elements. In particular, when high word lines are being programmed and the source side and drain side channel capacitance ratio becomes large, the reduction in the drain side boosting efficiency can become severe. To overcome this dilemma, a channel isolation switching method is proposed based on a source side early boosting scheme. With this approach, the isolation word line stays at a relatively high voltage, $V_{COND}$, such as 4 V, which is sufficient to turn the isolation storage element on even if it is at the highest programmed state, thereby connecting the source and drain side channels during the source side boosting. To further guarantee the connection of source and drain side channels in the selected NAND string, $V_{COND}$ can also be applied to word lines on the drain side of the isolation storage element up until the selected word line to open the associated storage elements, e.g., so they are in a conductive state or turned on. Further, if a programming technique is used in which storage elements on the drain side of the selected storage element may be at least partially programmed, $V_{COND}$ can be applied to these storage elements as well to keep them turned on during the source side boosting.

Since the source and drain side channels are connected, in the selected NAND strings, the channel potential will stay at 0-1 V and the source side will not be boosted up. As a result, the transfer of hot electrons from the drain side to the source side of the channel and the drain side injection type of disturb will be eliminated or reduced. In order to guarantee that the source side channel is connected with the drain side channel when the source side boosts up, $V_{COND}$ should be applied no later than $V_{PASS}$. To provide a safety margin, $V_{COND}$ can be applied shortly before $V_{PASS}$ starts to ramp up on the source side.

After the source side boosting finishes, the isolation word line voltage should be lowered to $V_{ISO}$ before the drain side boosting starts. In this way, the inhibited channel's drain side boosting (in unselected NAND strings) remains isolated from the source side. Additionally, the inhibited channel's boosting efficiency is improved since, during the source side boosting, many electrons in the drain side channel will flow to the source side, effectively causing some boosting of the drain side channel before $V_{PASS}$ is applied to the drain side word lines. On the other hand, in the selected NAND string, the channel potentials on source and drain sides still remain at 0-1 V, and again the drain side injection type of disturb is prevented or reduced.

FIG. 6 depicts a time line of word line and other voltages, based on the self-boosting mode of FIG. 5*a*. The time period shown depicts a single cycle of boosting and programming using a single programming pulse. This cycle is typically followed by a sequence of verify pulses to determine if the storage elements have reached a desired programming state. The cycle of boosting and programming is then repeated using another programming pulse, typically at a stepped-up amplitude. See FIG. 20. Note also that the time period shown may be preceded by an optional pre-charge period in which the drain side channel is partially charged up (pre-charged) by a bit line voltage of, e.g., 1.5-3 V which is transferred to the channel by opening (providing in a conducting state) the drain select gate. Typically, 0 V is applied to the word lines during pre-charging. Moreover, the bit line voltage of the selected NAND string does not always have to be 0 V. For example, $V_{BL}$ for the selected NAND string can be, e.g., 0-1 V. For the inhibited NAND string, in case the channel is pre-charged, $V_{CH-DRAIN}$ can be higher than 0 V even before boosting starts, but not necessarily equal to 1.5-3 V, as the amount of pre-charging depends on the erased $V_{TH}$ of the storage elements. If the storage elements are very deeply erased, pre-charging could actually reach the 1.5-3 V level. A typical pre-charge level is in the range of 1-2 V.

Waveform 800 depicts, in a simplified representation, the bit line voltage, $V_{BL}$, for the inhibited (unselected) NAND strings, the drain select gate voltage, $V_{SGD}$, which is common the a set of NAND strings, and the source voltage, $V_{SOURCE}$, which is common to a set of NAND strings. In practice, $V_{SOURCE}$ need not be equal to $V_{SGD}$ and $V_{BL}$, and there may also be timing differences between these waveforms. Waveform 805 depicts the bit line voltage, $V_{BL}$, for the selected NAND strings and the source select gate voltage, $V_{SGS}$, which is common to a set of NAND strings. In one alternative, $V_{BL}$ of the selected bit line can have more than one level. For example, in a quick pass write embodiment, typically two levels are used, such as 0 V and a higher level, typically 0.3-1 V. 0 V is used first to allow faster programming, while the higher level is used next to provide finer control of the threshold voltage of the storage elements being programmed that have almost reached their target threshold voltage.

Waveform 810 depicts the voltage applied to the word lines on the drain side of the selected word line. WLi denotes the ith or highest word line and WLn+1 denotes the word line adjacent to the selected word line (WLn) on the drain side. Waveform 815 depicts voltages applied to the selected word line (WLn). Waveform 820 depicts the voltage applied to the isolation word line (WLn−1), which is adjacent to the selected word line on the source side. Waveform 825 depicts the voltage which is applied to the word lines (WL0 through WLn−2) which are on the source side of the isolation word line WLn−1. Waveforms 830 and 835 depict the channel potential ($V_{CH-SOURCE}$) which exists in the channel of the substrate on the source side of the isolation word line, for the inhibited and selected NAND strings, respectively. Waveforms 840 and 845 depict the channel potential ($V_{CH-DRAIN}$) which exists in the channel of the substrate on the drain side of the isolation word line, for the inhibited and selected NAND strings, respectively. Note how $V_{CH-DRAIN}$ (waveform 840) tracks the drain side boosting voltage (waveform 810) and the program voltage (waveform 815). The extent to which the program voltage contributes to the drain side boosting depends on the number of storage elements at the drain side. With fewer storage elements at the drain side, the influence of the program voltage on the drain side boosting is greater.

Further, note that $V_{CH-DRAIN}$ (waveform 840) increases slightly at t1, during the source side boosting, since electrons in the drain side channel flow to the source side, effectively causing some boosting of the drain side channel before $V_{PASS}$ is applied to the drain side word lines, as discussed previously.

Along the bottom of the time line are time points t0-t9. In particular, at t0, as indicated by waveform 800, $V_{BL}$ for the inhibited (unselected) NAND strings and $V_{SGD}$ are increased from 0 V to e.g., 1.5-3 V. Also, $V_{SOURCE}$ increases from, e.g., 0.5-1.5 V. With $V_{SGS}$ at 0 V (waveform 805), this ensures that the source select gate for all NAND strings remains closed. For the selected NAND strings, $V_{BL}$=0 (or a little higher for quick pass write embodiments) so that, with $V_{SGD}$=1.5-3 V, the drain select gate is open to allow programming to occur. While the example provided corresponds to the boosting mode of FIG. 5a, essentially any type of boosting scheme which uses one or more isolation word lines on the source side of the selected word line may be used. For example, the example can be used in combination with local self-boosting (LSB) and/or revised LSB (RLSB) boosting modes. In LSB like modes, there may be one or more isolation word lines on the drain side as well so that the word lines neighboring the selected word line are at 0 V or other isolation voltage and the remaining unselected word lines are supplied $V_{PASS}$ or other voltages as described herein. RLSB is similar to REASB. The immediate neighboring drain and source side word lines of the isolation word line are supplied an intermediate voltage $V_{LOW}$, while the remaining unselected word lines are supplied $V_{PASS}$ or other voltages as described herein.

At t1, $V_{COND}$ is applied to WLn and WLn−1 so that the associated storage elements are turned on (e.g., provided in a conductive state). This allows charge transfer in the NAND string between the source side of the isolation word line (WLn−1) and the drain side of the selected word line (WLn).

At t2, boosting of the source side channel is initiated by applying $V_{PASS}$ to WL0 through WLn−2 (waveform 825). $V_{PASS}$ can be delayed relative to $V_{COND}$ as depicted to guarantee that the source side channel is connected with the drain side channel when the source side boosts up. The pass voltage boosts the channel of the NAND string on the source side of the isolation word line. Note the corresponding increase in $V_{CH-SOURCE}$ (waveform 830). In the channel region associated with WLn+1 through WLi, on the drain side of the selected word line, which is after the selected word line in the programming sequence, boosting is avoided due to a voltage such as 0 V which is applied. Although, some boosting may already occur due to electrons flowing from the drain side to the boosted source side. Between t2 and t3, boosting of the source side channel occurs. After t3, $V_{ISO}$ is applied to close the associated storage element of the isolation word line (WLn−1), thereby discouraging charge transfer in the NAND string between the source side of the isolation word line (WLn−1) and the drain side of the selected word line (WLn).

After a delay, which is needed to make sure that WLn−1 has reached the $V_{ISO}$ level, and starting at t4, boosting of the drain side channel is initiated by applying $V_{PASS}$ (waveform 810). Note the corresponding increase in $V_{CH-DRAIN}$ (waveform 840). Boosting of the source and drain side channels continues until t8. Further, at t5, $V_{PGM1}$ is applied to WLn and, at t6, $V_{PGM2}$ is applied to WLn. Thus, the program voltage can be applied initially at a first level and subsequently at a higher second level. This approach avoids abrupt changes in $V_{CH-DRAIN}$ which may be caused by abrupt changes in $V_{PGM}$. However, a single stepped $V_{PGM}$ pulse may alternatively be used. Note, furthermore, that in some embodiments, $V_{PGM1}$ may be equal to $V_{PASS}$ and that in some cases the time between t4 and t5 may be equal to zero, so that $V_{PGM1}$ and $V_{PASS}$ are essentially ramped up at the same time. At t7, the program voltage is removed, at t8, the boosting voltages are removed and, at t9, the boosting and programming cycle ends. Thus, source side boosting occurs between t1 and t8 and drain side boosting occurs between t4 and t8.

Due to the source side boosting and the application of voltages for opening the storage elements associated with WLn and WLn−1 between t1 and t3, charge transfer can occur between the source side and drain side channels during this time period. For example, many electrons in the drain side channel will flow to the source side, effectively causing some boosting of the drain side channel before $V_{PASS}$ is applied to the drain side word lines. Further, removal of $V_{COND}$ at t3, before the drain side boosting starts, serves to isolate the inhibited channel's subsequent drain side boosting from the source side.

FIG. 7 depicts a time line of word line and other voltages, based on the self-boosting mode of FIG. 5b. The time lines of FIG. 7 vary from those of FIG. 6 in that WLn+1, the word line on the drain side of the selected word line, WLn, and adjacent to the selected word line, receives $V_{COND}$ instead of 0 V between t1 and t3 (waveform 812). This approach may be used, e.g., when the non-volatile storage elements associated with WLn+1 may be partially programmed. Additionally, the word line WLn−1 which is between the selected word line WLn and the isolation word line WLn−2 receives $V_{LOW}$ between t4 and t8, where $V_{LOW} > V_{ISO}$ (waveform 817). This provides a gradual transition from $V_{PGM2}$ to $V_{ISO}$ over one or more intermediate word lines. Waveform 810 is then applied to WLn+2 through WLi, waveform 820 is applied to WLn−2 and waveform 825 is applied to WL0 through WLn−3.

It is also possible for the level of $V_{COND}$ to vary for the different word lines to which it is applied. For example, $V_{COND}$ can be set based on the programming state of the corresponding non-volatile storage elements. $V_{COND}$ can be higher when the associated non-volatile storage element has a higher programmed state, and lower when the associated non-volatile storage element has a lower programmed state. $V_{COND}$ need only be high enough to create a conducting path between the source side and the drain side channel area. Providing different levels of $V_{COND}$ allows a flexibility to address data pattern dependencies. Depending on the back pattern, e.g., the data pattern, as an example, WLn+1 could be in a lower middle state B' (FIG. 18a), while WLn and word lines below WLn could be at state C (FIG. 18c), the highest programmed state. In this case, $V_{COND\text{-}LOW}$ can be applied to WLn+1 and $V_{COND\text{-}HIGH}$ can be applied to WLn−2 through WLn, where $V_{COND\text{-}HIGH} > V_{COND\text{-}LOW}$.

FIG. 8 depicts a time line of word line and other voltages, based on the self-boosting mode of FIG. 5c. The time lines of FIG. 8 vary from those of FIG. 7 in that WLn−1, the word line on the source side of the selected word line, WLn, and adjacent to the selected word line, receives $V_{PASS}$ instead of $V_{LOW}$ between t4 and t8 (waveform 816). Waveform 817 is then applied to WLn−2, waveform 820 is applied to WLn−3 and waveform 825 is applied to WL0 through WLn−4. This provides an even more gradual transition from $V_{PGM2}$ to $V_{ISO}$ over one or more intermediate word lines.

As a further alternative which can be used, e.g., when the non-volatile storage elements associated with WLn+1 are not programmed, 0 V can be applied to WLn+1 between t1 and t3 instead of $V_{COND}$.

FIG. 9 depicts a time line of word line and other voltages, as an alternative to the time line of FIG. 8. The time lines of FIG. 9 vary from those of FIG. 8 in that a gradual transition in voltage is made from $V_{COND}$ to the subsequent voltage, e.g., from $V_{COND}$ to $V_{PASS}$ on WLn+1 (waveform 912) and WLn−1 (waveform 916), from $V_{COND}$ to $V_{PGM1}$ on WLn (waveform 915) and/or from $V_{COND}$ to $V_{LOW}$ on WLn (waveform 917). The voltages thus can ramp up or down to $V_{PASS}$ or $V_{LOW}$ directly from $V_{COND}$ between the source and drain side boosting transition, in the time period between t3 and t4.

An advantage of this approach is that GIDL at the $V_{ISO}$ and/or $V_{LOW}$ word lines can be prevented or reduced. In the above example of FIGS. 7 and 8, the $V_{LOW}$ word line is pulled down to 0 V before the voltage $V_{LOW}$ is applied. Especially in combination with some of the boosting modes, this can cause an increase in GIDL. The purpose of applying $V_{LOW}$ is to reduce the electric fields during boosting. However, when the voltage on the $V_{LOW}$ word line is lowered from $V_{COND}$ to 0 V, the electric field in the neighborhood of that word line is increased due to the boosted source side and GIDL may occur. This increase in the electric field can be prevented by ramping the signal on the $V_{LOW}$ word line directly from $V_{COND}$ to $V_{LOW}$.

Further, if $V_{LOW} > V_{COND}$, it can be advantageous to apply $V_{LOW}$ to the word line instead of $V_{COND}$, for instance, with the boosting scheme of FIG. 5d, in which $V_{LOW}$ is applied on WLn−4 and WLn−2 and $V_{ISO}$ is applied on WLn−3. In this case, to reduce the probability of GIDL occurring on WLn−3 (when the word line voltage transitions from $V_{COND}$ to $V_{ISO}$) or on WLn−4 (due to $V_{COND}$), it may be preferred to keep WLn−4 biased to $V_{LOW}$ from the start.

The remaining boosting modes of FIGS. 5a-5h, as well as other boosting modes, can similarly be implemented using similar time lines as discussed herein. For example, with the boosting mode of FIG. 5h, as discussed, three or more different channel regions can be boosted. For the case where the first and third channel regions are boosted together, after which the second channel region is boosted, the first and third channel regions can be boosted in what is referred to as the source side boosting in FIGS. 6-9, while the second channel region can be boosted in what is referred to as the drain side boosting. For the case where the first channel region is boosted, after which the second and third channel regions are boosted together, the first channel region can be boosted in what is referred to as the source side boosting, while the second and third channel regions can be boosted in what is referred to as the drain side boosting. For the case where the first channel region is boosted, after which the third channel region is boosted, after which the second channel region is boosted, the first channel region can be boosted in what is referred to as the source side boosting, the third channel region can be boosted in time period after what is referred to as the source side boosting and prior to what is referred to as the drain side boosting, and the second channel region can be boosted in what is referred to as the drain side boosting.

FIG. 10 depicts a programming process in which a source side of a NAND string is boosted before a drain side of the NAND string. The process is illustrated in connection with the boosting scheme of FIG. 8, although many variations are possible. Programming begins at step 1000, and a word line is selected for programming at step 1005. Source side boosting begins at step 1010. At step 1015, $V_{COND}$ is set on the isolation word line (WLn−3) through the furthest word line on the drain side of the isolation word line which has been used for programming (WLn+1). At step 1020, $V_{PASS}$ is set on the word lines on the source side of the isolation word line. At step 1025, 0 V is set on the remaining drain side word lines, e.g., WLn+2 through WLi and, at step 1030, the source side boosting ends. That is, generally, the boosted source side level is maintained but not boosted further. At step 1035, drain side boosting along with programming begins. The drain side boosting may be initiated before the programming, as illustrated previously. At step 1040, voltages are applied to the unselected word lines in accordance with the selected boosting mode. At step 1045, a programming pulse is applied to the selected word line. The drain side boosting and the programming pulse end at step 1050.

Figure 16:
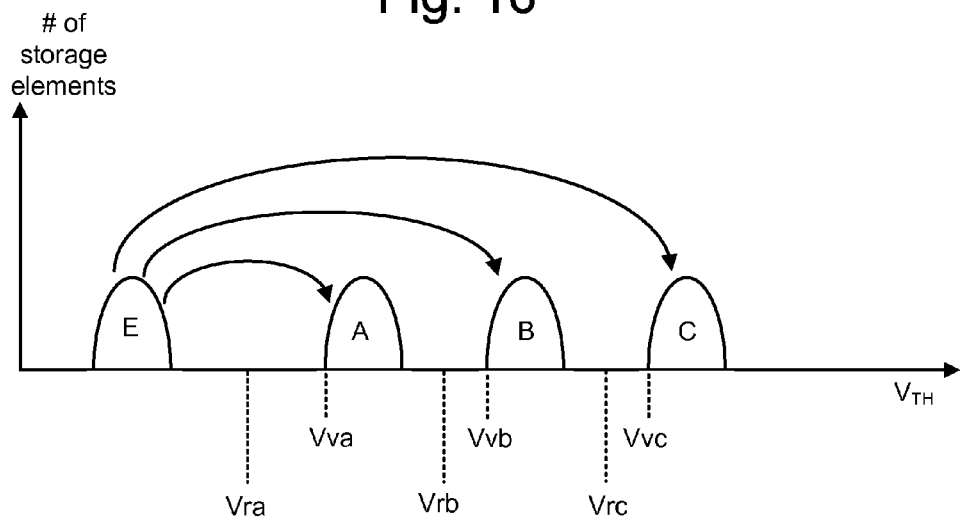
FIG. 16 depicts an example set of threshold voltage distributions and one-pass programming.

A verify operation is performed at step 1055 to determine whether a selected storage element has been programmed to a desired target threshold voltage level, e.g., Vva, Vvb or Vvc (FIG. 16). At decision block 1060, if programming for the current word line is not complete, an additional cycle of source side boosting followed by drain side boosting and programming is repeated, starting at step 1010. If programming for the current word line is complete but programming for all word lines is not complete, at decision step 1065, the next word line is selected for programming at step 1075. If programming for the current word line and all word lines is complete, programming ends at step 1070.

Note that, in an alternative implementation, a word line dependency may be used in which a boosting scheme which does not use source side boosting followed by drain side boosting is used for lower word lines, such as WL0-WL22 in a 32 word line NAND string. A boosting scheme which does use source side boosting followed by drain side boosting can then be used for higher word lines, such as WL23-WL31, where the type of program disturb which is addressed is more problematic.

Figure 11:
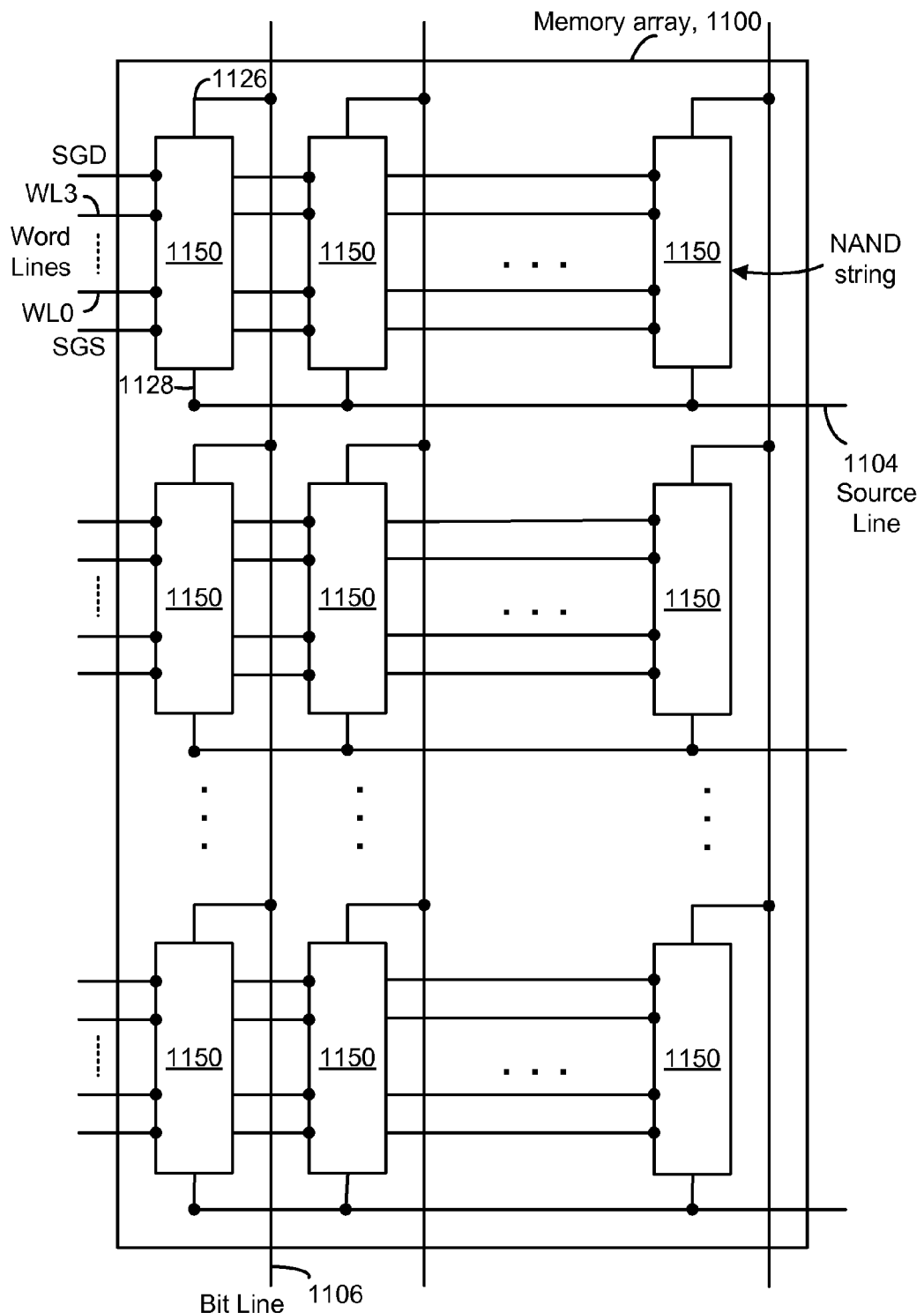
FIG. 11 is a block diagram of an array of NAND flash storage elements.

FIG. 11 illustrates an example of an array 1100 of NAND storage elements, such as those shown in FIGS. 1 and 2. Along each column, a bit line 1106 is coupled to the drain terminal 1126 of the drain select gate for the NAND string 1150. Along each row of NAND strings, a source line 1104 may connect all the source terminals 1128 of the source select gates of the NAND strings. An example of a NAND architecture array and its operation as part of a memory system is found in U.S. Pat. Nos. 5,570,315; 5,774,397; and 6,046,935. The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 14-22 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 12:
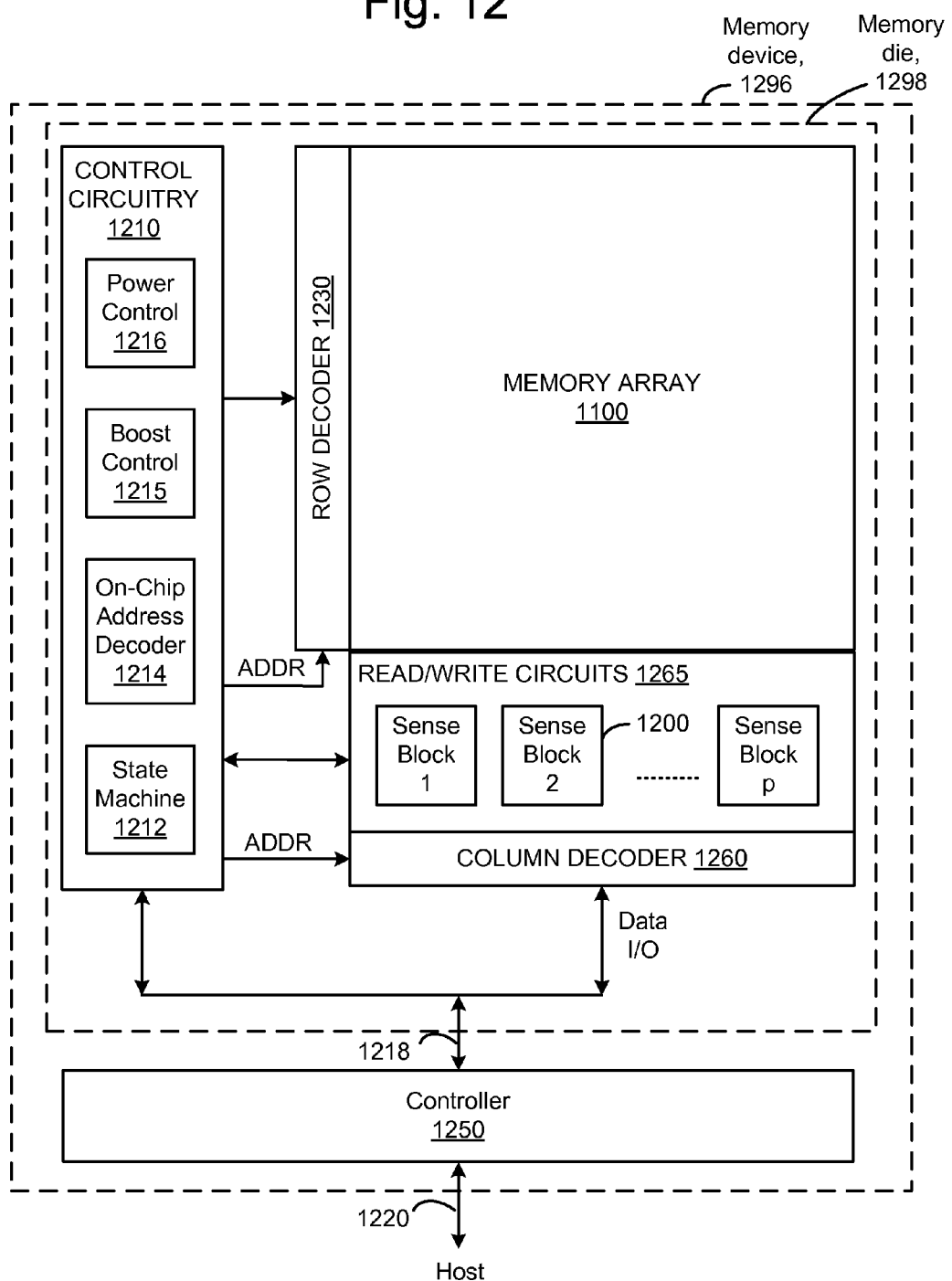
FIG. 12 is a block diagram of a non-volatile memory system using single row/column decoders and read/write circuits.

FIG. 12 is a block diagram of a non-volatile memory system using single row/column decoders and read/write circuits. The diagram illustrates a memory device 1296 having read/write circuits for reading and programming a page of storage elements in parallel, according to one embodiment of the present invention. Memory device 1296 may include one or more memory die 1298. Memory die 1298 includes a two-dimensional array of storage elements 1100, control circuitry 1210, and read/write circuits 1265. In some embodiments, the array of storage elements can be three dimensional. The memory array 1100 is addressable by word lines via a row decoder 1230 and by bit lines via a column decoder 1260. The read/write circuits 1265 include multiple sense blocks 1200 and allow a page of storage elements to be read or programmed in parallel. Typically a controller 1250 is included in the same memory device 1296 (e.g., a removable storage card) as the one or more memory die 1298. Commands and Data are transferred between the host and controller 1250 via lines 1220 and between the controller and the one or more memory die 1298 via lines 1218.

The control circuitry 1210 cooperates with the read/write circuits 1265 to perform memory operations on the memory array 1100. The control circuitry 1210 includes a state machine 1212, an on-chip address decoder 1214, a boost control 1215 and a power control module 1216. The state machine 1212 provides chip-level control of memory operations. The on-chip address decoder 1214 provides an address interface between that used by the host or a memory controller to the hardware address used by the decoders 1230 and 1260. The boost control 1215 can be used for setting a boost mode, including determining a timing for initiating source side and drain side boosting, as discussed herein. The power control module 1216 controls the power and voltages supplied to the word lines and bit lines during memory operations.

In some implementations, some of the components of FIG. 12 can be combined. In various designs, one or more of the components (alone or in combination), other than storage element array 1100, can be thought of as a managing circuit. For example, one or more managing circuits may include any one of or a combination of control circuitry 1210, state machine 1212, decoders 1214/1260, power control 1216, sense blocks 1200, read/write circuits 1265, controller 1250, etc.

Figure 13:
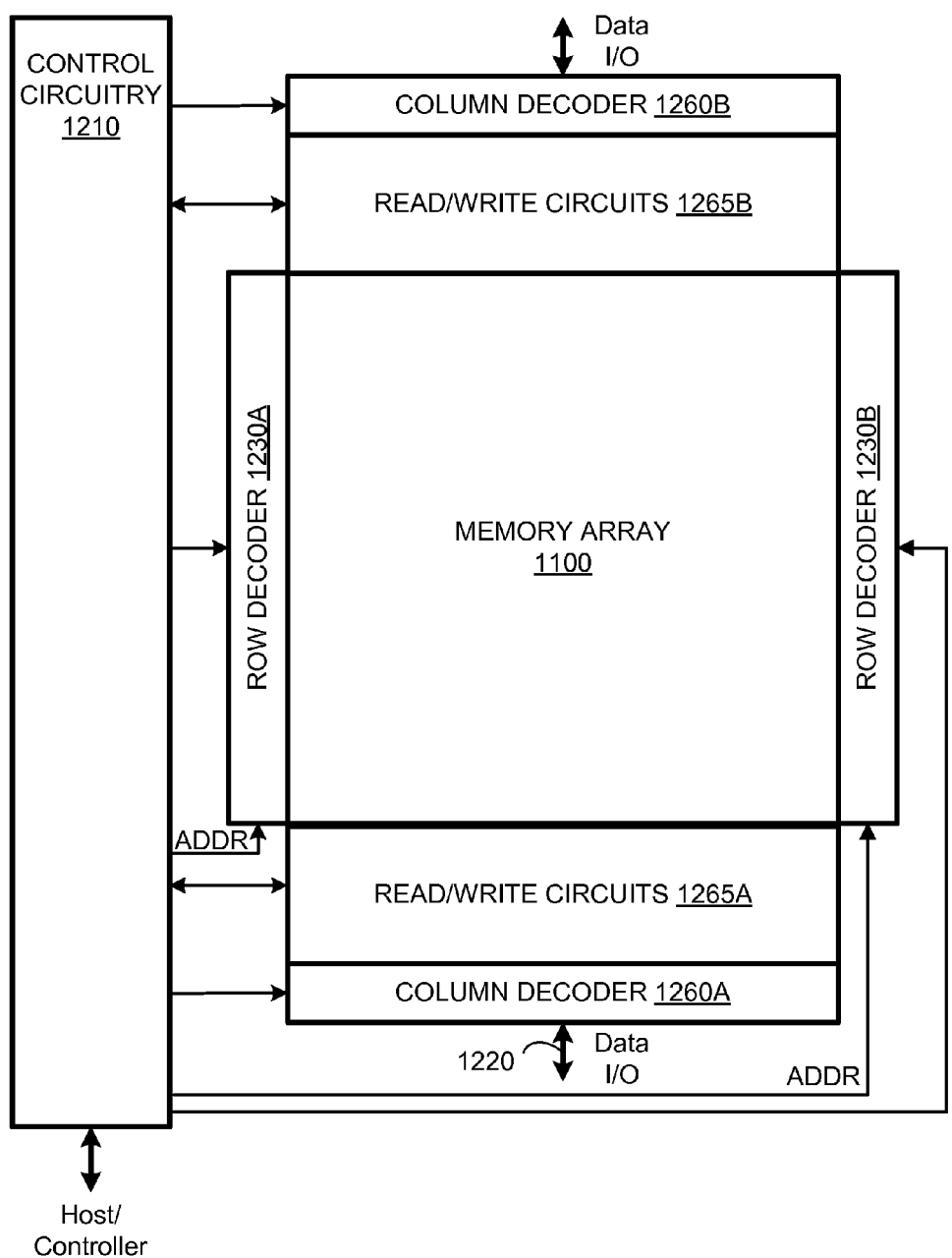
FIG. 13 is a block diagram of a non-volatile memory system using dual row/column decoders and read/write circuits.

FIG. 13 is a block diagram of a non-volatile memory system using dual row/column decoders and read/write circuits. Here, another arrangement of the memory device 1296 shown in FIG. 12 is provided. Access to the memory array 1100 by the various peripheral circuits is implemented in a symmetric fashion, on opposite sides of the array, so that the densities of access lines and circuitry on each side are reduced by half. Thus, the row decoder is split into row decoders 1230A and 1230B and the column decoder into column decoders 1260A and 1260B. Similarly, the read/write circuits are split into read/write circuits 1265A connecting to bit lines from the bottom and read/write circuits 1265B connecting to bit lines from the top of the array 1100. In this way, the density of the read/write modules is essentially reduced by one half. The device of FIG. 13 can also include a controller, as described above for the device of FIG. 12.

Figure 14:
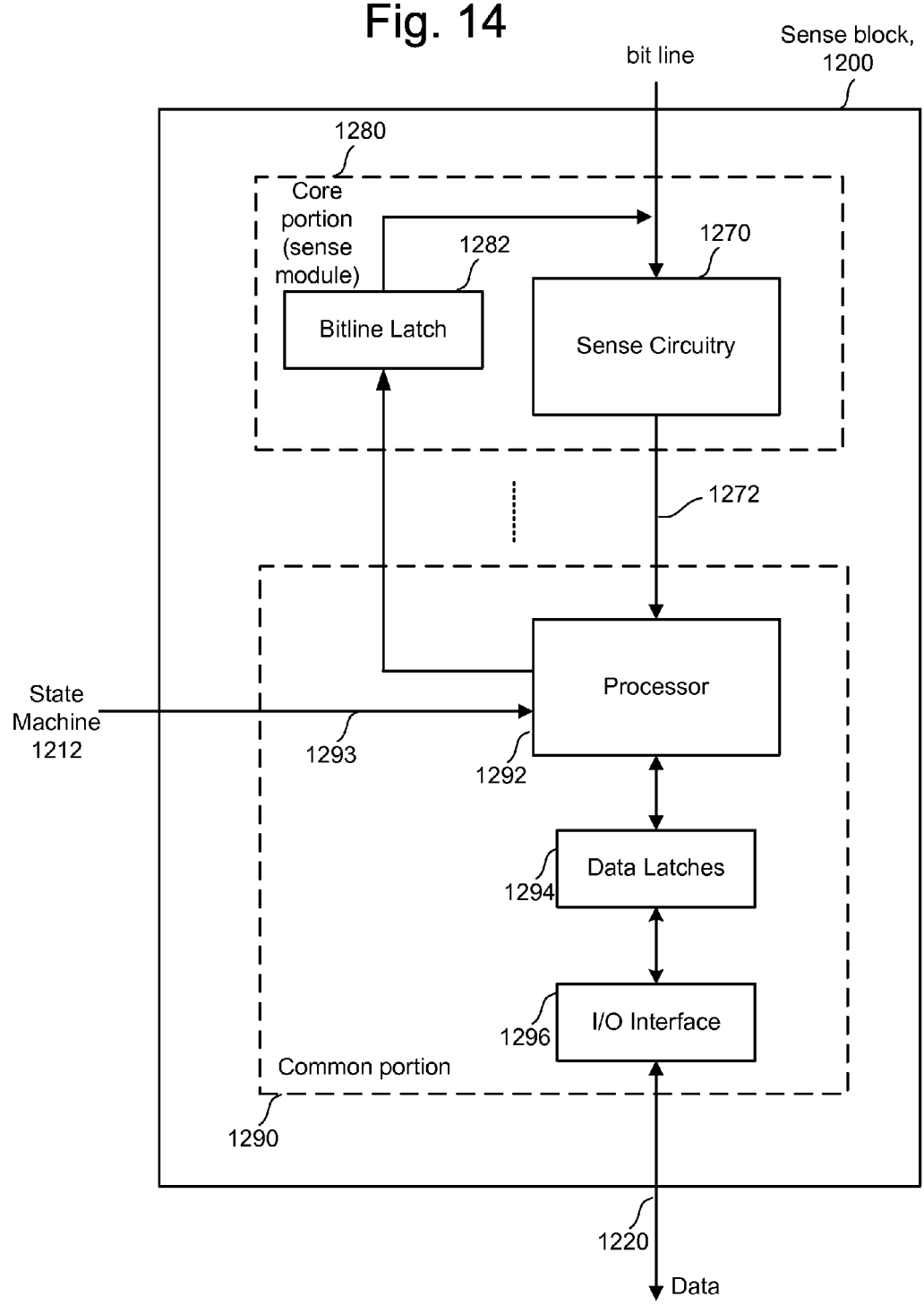
FIG. 14 is a block diagram depicting one embodiment of a sense block.

FIG. 14 is a block diagram depicting one embodiment of a sense block. An individual sense block 1200 is partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details refer to U.S. Patent Application Pub No. 2006/0140007, titled "Non-Volatile Memory and Method with Shared Processing for an Aggregate of Sense Amplifiers" published Jun. 29, 2006, and incorporated herein by reference in its entirety.

Sense module 1280 comprises sense circuitry 1270 that determines whether a conduction current in a connected bit line is above or below a predetermined threshold level. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., 1.5-3 V).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed storage element and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1212 that controls the supply of different control gate voltages to the addressed storage element. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1292 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1294 from the data bus 1220. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1292 monitors the read back memory state relative to the desired memory state. When the two are in agreement, the processor 1292 sets the bit line latch 1282 so as to cause the bit line to be pulled to a state designating program inhibit. This inhibits the storage element coupled to the bit line from further programming even if programming pulses appear on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are three data latches per sense module 1280. In some implementations (but not required), the data latches are implemented as a shift register so that the parallel data stored therein is converted to serial data for data bus 1220, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Pat. No. 7,196,931, titled, "Non-Volatile Memory And Method With Reduced Source Line Bias Errors," issued Mar. 27, 2007; (2) U.S. Pat. No. 7,023,736, title "Non-Volatile Memory And Method with Improved Sensing," issued Apr. 4, 2006; (3) U.S. Pat. No. 7,046,568, titled "Improved Memory Sensing Circuit And Method For Low Voltage Operation," issued May 16, 2006; (4) U.S. Patent Application Publication No. 2006/0221692, titled "Compensating for Coupling During Read Operations of Non-Volatile Memory," published Aug. 5, 2006; and (5) U.S. Patent Application Publication No. 20060158947, titled "Reference Sense Amplifier For Non-Volatile Memory, published Jul. 20, 2006. All five of the immediately above-listed patent documents are incorporated herein by reference in their entirety.

Figure 15:
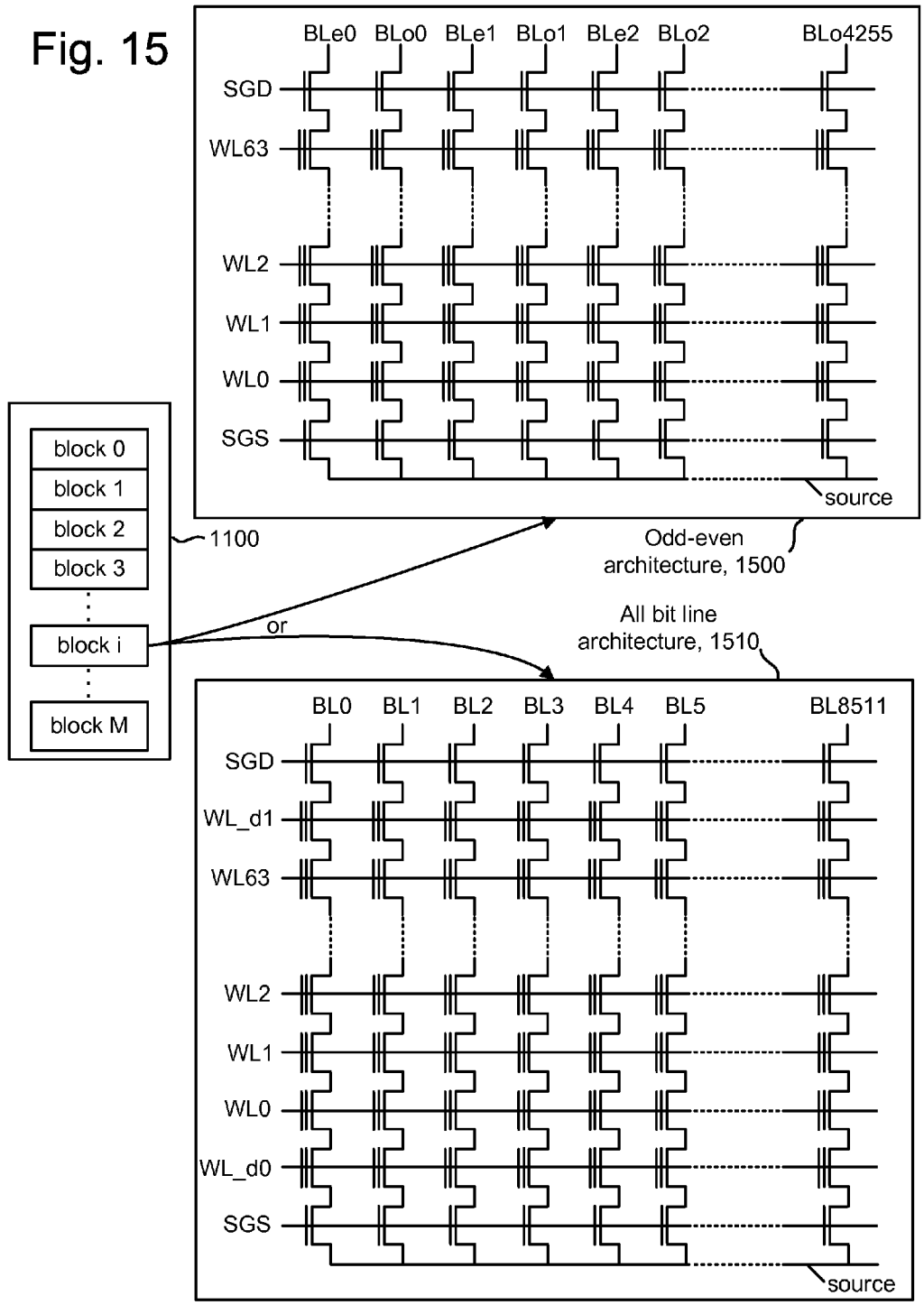
FIG. 15 illustrates an example of an organization of a memory array into blocks for an all bit line memory architecture or for an odd-even memory architecture.

FIG. 15 illustrates an example of an organization of a memory array into blocks for an all bit line memory architecture or for an odd-even memory architecture. Exemplary structures of memory array 1100 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 1510), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 1500), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns. In this example, four storage elements are shown connected in series to form a NAND string. Although four storage elements are shown to be included in each NAND string, more or fewer than four storage elements can be used.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5-4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

FIG. 16 depicts an example set of threshold voltage distributions and one-pass programming. Example $V_{TH}$ distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Patent Application Publication No. 2004/0255090, published Dec. 16, 2004, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or less than four states.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG. 20 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 reaches a maximum since the change in amount of charge on the floating gate under WLn is the largest as compared to the change in charge when programming from state E to state A or state E to state B. When programming from state E to state B the amount of coupling to the adjacent floating gate is less. When programming from state E to state A the amount of coupling is reduced even further.

Figure 17:
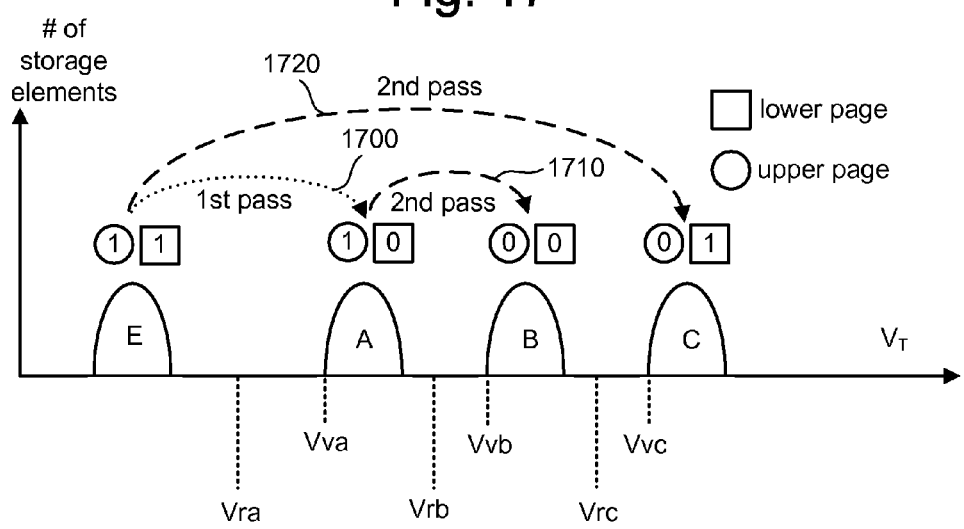
FIG. 17 depicts an example set of threshold voltage distributions and two-pass programming.

FIG. 17 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 1700. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 1720. If the storage element had been programmed into state A as a result of the first programming pass, then the storage element is further programmed in the second pass so that the threshold voltage is increased to be within state B, as depicted by arrow 1710. The result of the second pass is to program the storage element into the state designated to store a logic "0" for the upper page without changing the data for the lower page. In both FIG. 16 and FIG. 17, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Patent Application Pub. No. 2006/0126390, titled "Pipelined Programming of Non-Volatile Memories Using Early Data," published Jun. 15, 2006, incorporated herein by reference in its entirety.

Figure 18A:
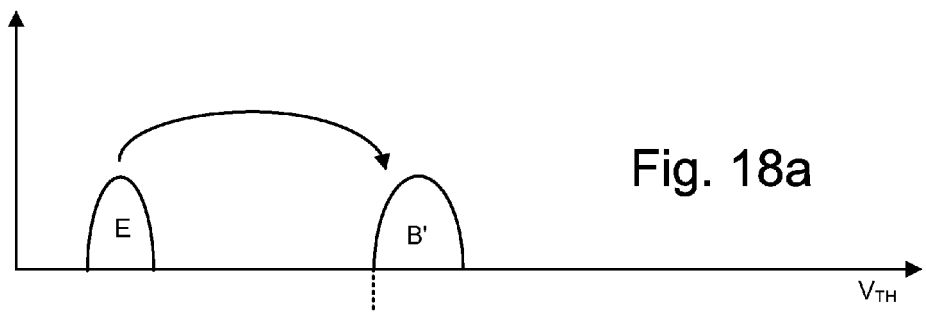
FIGS. 18a-c show various threshold voltage distributions and describe a process for programming non-volatile memory.
Figure 18B:
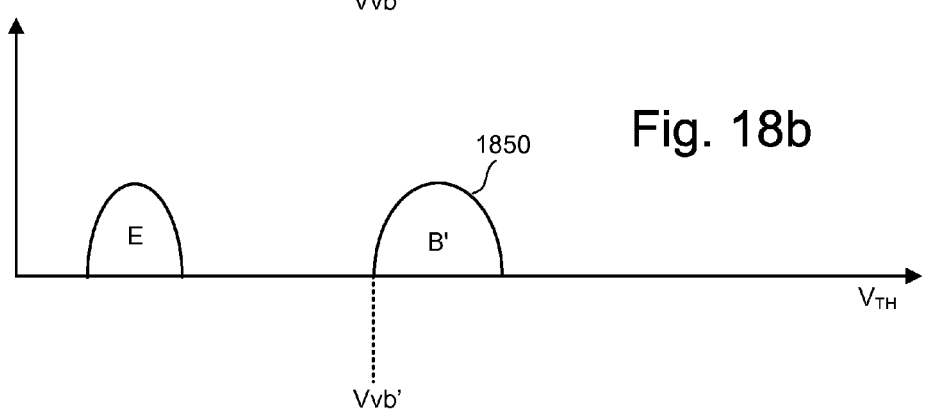
Figure 18C:
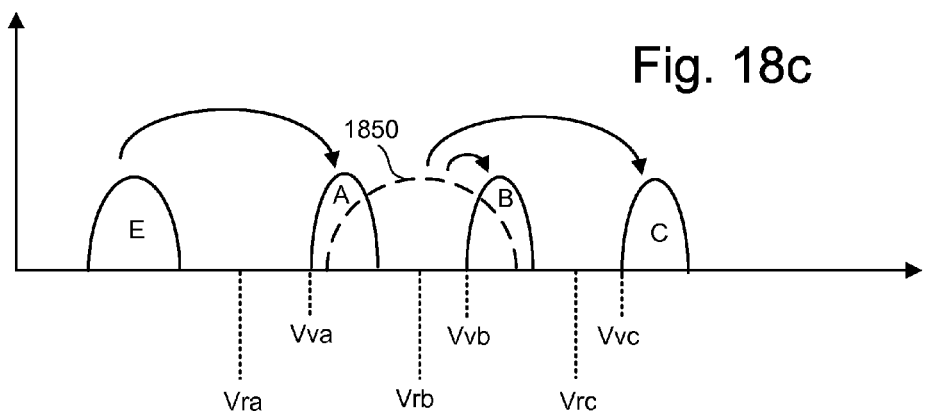

FIGS. 18*a-c* disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 18*a* therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1850 of FIG. 18*b*. This apparent widening of the threshold voltage distribution will be remedied when programming the upper page.

FIG. 18*c* depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 1850 and the upper page data is to remain at 1, then the storage element will be programmed to final state B. If the storage element is in intermediate threshold voltage distribution 1850 and the upper page data is to become data 0, then the threshold voltage of the storage element will be raised so that the storage element is in state C. The process depicted by FIGS. 18*a-c* reduces the effect of floating gate to floating gate coupling because only the upper page programming of neighbor storage elements will have an effect on the apparent threshold voltage of a given storage element. An example of an alternate state coding is to move from distribution 1850 to state C when the upper page data is a 1, and to move to state B when the upper page data is a 0.

Although FIGS. 18*a-c* provide an example with respect to four data states and two pages of data, the concepts taught can be applied to other implementations with more or fewer than four states and more or less than two pages.

Figure 19:
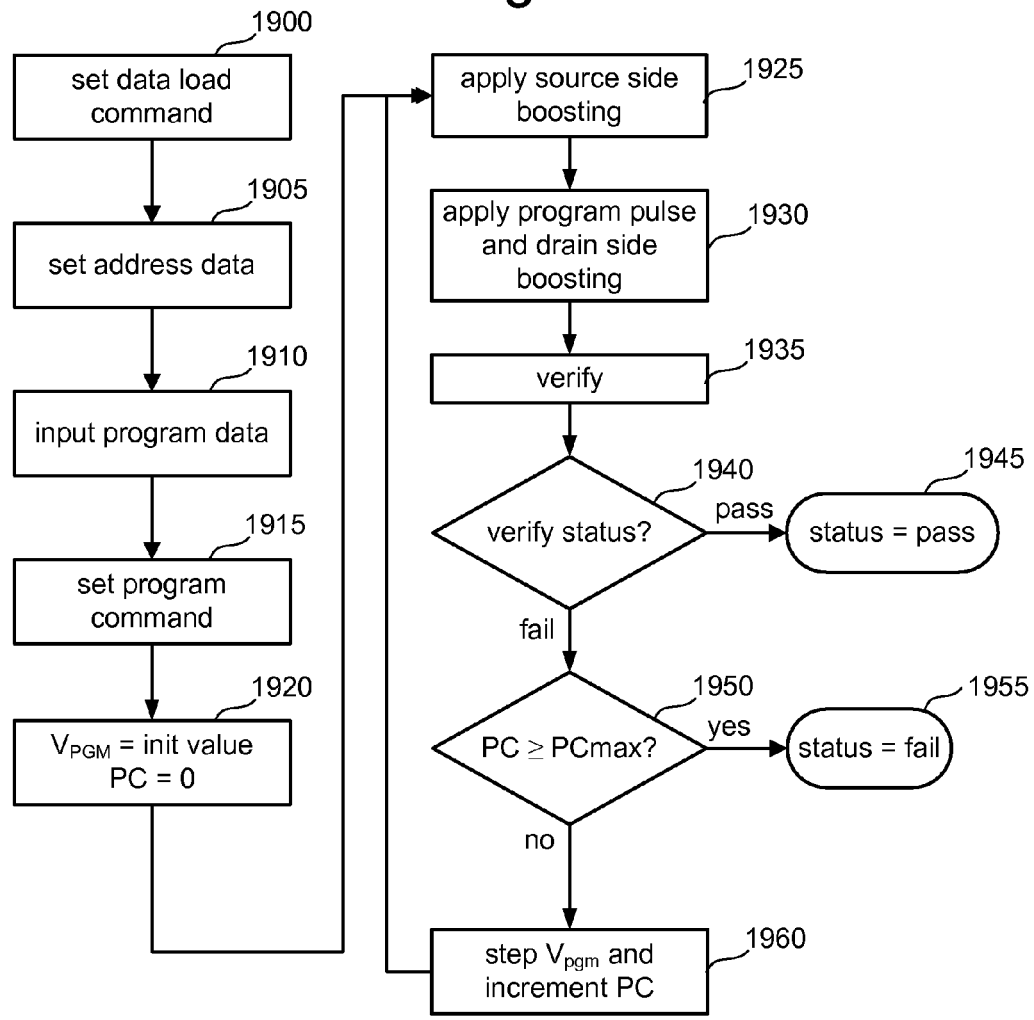
FIG. 19 is a flow chart describing one embodiment of a process for programming non-volatile memory.

FIG. 19 is a flow chart describing one embodiment of a method for programming non-volatile memory. In one implementation, storage elements are erased (in blocks or other units) prior to programming. In step 1900, a "data load" command is issued by the controller and input received by control circuitry 1210. In step 1905, address data designating the page address is input to decoder 1214 from the controller or host. In step 1910, a page of program data for the addressed page is input to a data buffer for programming. That data is latched in the appropriate set of latches. In step 1915, a "program" command is issued by the controller to state machine 1212.

Figure 20:
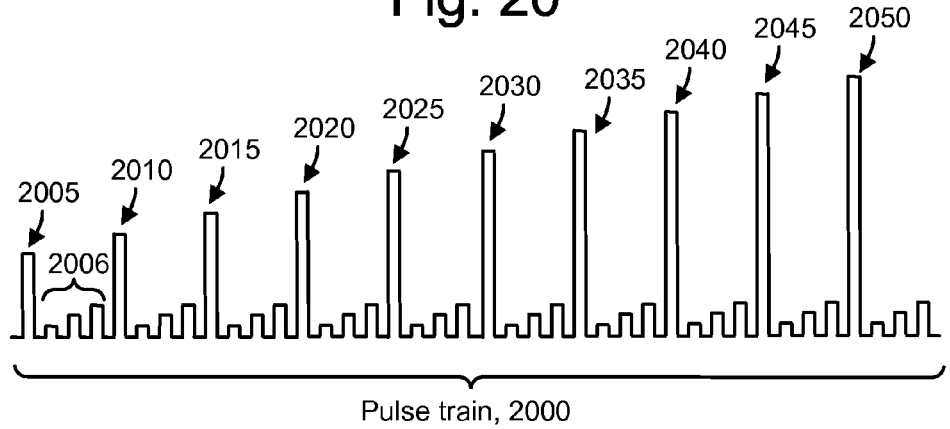
FIG. 20 depicts an example pulse train applied to the control gates of non-volatile storage elements during programming.

Triggered by the "program" command, the data latched in step 1910 will be programmed into the selected storage elements controlled by state machine 1212 using the stepped program pulses of the pulse train 2000 of FIG. 20 applied to the appropriate selected word line. In step 1920, the program voltage, $V_{PGM}$, is initialized to the starting pulse (e.g., 12 V or other value) and a program counter (PC) maintained by state machine 1212 is initialized at zero. In step 1925, source boosting is applied, as discussed previously. At step 1930, the first $V_{PGM}$ pulse is applied to the selected word line to begin programming storage elements associated with the selected word line, and drain side boosting occurs, as discussed previously. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to 1.5-3 V to inhibit programming.

In step 1935, the states of the selected storage elements are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 1940, a check is made as to whether all of the data latches are storing logic "1." If all of the data latches are storing logic "1," the programming process is complete and successful because all selected storage elements were programmed and verified. A status of "PASS" is reported in step 1945. In some embodiments, the programming process is considered complete and successful even if not all selected storage elements were verified as being programmed. In such a case, errors during subsequent read operations can occur due to insufficient programmed storage elements. However, these errors can be corrected by ECC.

If, in step 1940, it is determined that not all of the data latches are storing logic "1," then the programming process continues. In some embodiments, the program process stops even if not all of the data latches are storing logic "1". In step 1950, the program counter PC is checked against a program limit value PCmax. One example of a program limit value is twenty; however, other numbers can also be used. If the program counter PC is not less than PCmax, then the program process has failed and a status of "FAIL" is reported in step 1955. If the program counter PC is less than PCmax, then $V_{PGM}$ is increased by the step size and the program counter PC is incremented in step 1960. The process then loops back to step 1930 to apply the next $V_{PGM}$ pulse.

FIG. 20 depicts an example pulse train 2000 applied to the control gates of non-volatile storage elements during programming, and a switch in boost mode which occurs during a pulse train. The pulse train 2000 includes a series of program pulses 2005, 2010, 2015, 2020, 2025, 2030, 2035, 2040, 2045, 2050, . . . , that are applied to a word line selected for programming. In one embodiment, the programming pulses have a voltage, $V_{PGM}$, which starts at 12 V and increases by increments, e.g., 0.5 V, for each successive programming pulse until a maximum of, e.g., 20-25 V is reached. In between the program pulses are verify pulses. For example, verify pulse set 2006 includes three verify pulses. In some embodiments, there can be a verify pulse for each state that data is being programmed into, e.g., state A, B and C. In other embodiments, there can be more or fewer verify pulses. The verify pulses in each set can have amplitudes of Vva, Vvb and Vvc (FIG. 17) or Vvb' (FIG. 18a), for instance.

As mentioned, the voltages which are applied to word lines to implement a boost mode are applied when programming occurs, e.g., prior to and during a program pulse. On the other hand, during the verify process, for instance, which occurs between program pulses, the boost voltages are not applied. Instead, read voltages, which are typically less than the boost voltages, are applied to the unselected word lines. The read voltages have an amplitude which is sufficient to open the previously programmed storage elements in a NAND string when the threshold voltage of a currently-programmed storage element is being compared to a verify level.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:
    performing first boosting of at least one NAND string on a source side of a first word line before boosting the at least one NAND string on a drain side of a second word line, the second word line is on a drain side of the first word line, a plurality of word lines including the first and second word lines are associated with the at least one NAND string, and the at least one NAND string has a plurality of non-volatile storage elements;
    during the first boosting, applying a voltage to the first word line for providing a first non-volatile storage element of the plurality of non-volatile storage elements which is associated with the first word line in a conducting state, and applying a voltage to the second word line for providing a second non-volatile storage element of the plurality of non-volatile storage elements which is associated with the second word line in a conducting state; and
    performing second boosting of the at least one NAND string on the drain side of the second word line, after the first boosting, while applying a voltage to the first word line for providing the first non-volatile storage element in a non-conducting state, and while applying a program voltage to the second word line.

2. The method of claim 1, wherein:
    during the second boosting, a voltage at a first level is applied to word lines of the plurality of word lines on the drain side of the second word line, the voltage applied to the first word line is at a second level which is less than the first level, and a voltage at a level greater than the second level is applied to at least one in between word line which is between the first word line and the second word line.

3. The method of claim 2, wherein:
    during the second boosting, applying a voltage at a level which is between the first and second levels to a word line of the plurality of word lines which is between the at least one in between word line and the first word line.

4. The method of claim 2, wherein:
    during the second boosting, applying a voltage at a level which is between the first and second levels to a word line of the plurality of word lines which is on the source side of the first word line, adjacent to the first word line.

5. The method of claim 1, further comprising:
during the first boosting, applying a voltage to at least one word line of the plurality of word lines which is between the first and second word lines for providing at least one non-volatile storage element of the plurality of non-volatile storage elements which is between the first and second word lines in a conducting state, so that every non-volatile storage element in the at least one NAND string between the first and second non-volatile storage elements is provided in a conducting state.

6. The method of claim 1, further comprising:
during the first boosting, applying a voltage to at least one word line of the plurality of word lines which is on the drain side of the second word line, adjacent to the second word line, for providing at least one non-volatile storage element of the plurality of non-volatile storage elements which is on the drain side of the second word line, adjacent to the second word line in a conducting state.

7. The method of claim 1, further comprising:
during the first boosting, applying a voltage to a set of word lines of the plurality of word lines which is on the drain side of the second word line for avoiding boosting of the at least one NAND string on the drain side of the second word line.

8. The method of claim 1, wherein:
the voltage applied to the second word line for providing the second non-volatile storage element in a conducting state is at a first level; and
the first boosting is performed by applying a voltage at a second level, greater than the first level, to a set of word lines of the plurality of word lines which is on the source side of the first word line.

9. The method of claim 1, wherein:
providing the first and second non-volatile storage elements in a conducting state allows charge transfer in the at least one NAND string between the source side of the first word line and the drain side of the second word line; and
providing the first storage element in a non-conducting state discourages charge transfer in the at least one NAND string between the source side of the first word line and the drain side of the second word line.

10. The method of claim 1, further comprising:
during the first boosting, applying a voltage to at least one word line of the plurality of word lines which is on the drain side of the second word line for providing at least a third non-volatile storage element of the plurality of non-volatile storage elements which is on the drain side of the second word line in a conducting state, and applying a voltage to a set of word lines of the plurality of word lines which is on a drain side of the at least a third non-volatile storage element, for avoiding boosting of the at least one NAND string on a drain side of the at least a third non-volatile storage element.

11. The method of claim 10, wherein:
the at least a third non-volatile storage element is adjacent to the second word line.

12. The method of claim 1, wherein:
the voltage applied to the first word line for providing the first non-volatile storage element in a conducting state is at a first level; and
the first boosting is performed by applying voltages at a second level, greater than the first level, to a set of non-volatile storage elements in the at least one NAND string which is on the source side of the first non-volatile storage element.

13. The method of claim 12, further comprising:
applying voltages at a third level, less than the first level, to a set of non-volatile storage elements of the plurality of non-volatile storage elements which is on a drain side of the second non-volatile storage element, while performing the first boosting.

14. The method of claim 13, further comprising:
applying voltages at the second level to the set of non-volatile storage elements in the at least one NAND string which is on the drain side of the second non-volatile storage element, while performing the second boosting.

15. The method of claim 1, wherein:
the second non-volatile storage element is programmed by the program voltage.

16. The method of claim 1, further comprising:
during the second boosting, applying a voltage to at least one of the word lines of the plurality of word lines which is between the first word line and the second word line for boosting the at least one NAND string between the first word line and the second word line.

17. The method of claim 1, further comprising, during the second boosting:
applying a voltage to an additional word line for providing an additional non-volatile storage element in a non-conducting state, the additional word line is on a drain side of the second word line, the second boosting is performed on a portion of the at least one NAND string which is between the second word line and the additional word line; and
performing third boosting of the at least one NAND string on a drain side of the additional word line.

18. A method for operating non-volatile storage, comprising:
performing first boosting of at least one NAND string on a side of a first non-volatile storage element in the at least one NAND string which is before the first non-volatile storage element in a programming sequence;
during the first boosting, providing the first non-volatile storage element and a second non-volatile storage element in the at least one NAND string which is on a side of the first non-volatile storage element which is after the first non-volatile storage element in the programming sequence in a conducting state; and
performing second boosting of the at least one NAND string, after the first boosting, on a side of the second non-volatile storage element which is after the second non-volatile storage element in the programming sequence while providing the first storage element in a non-conducting state.

19. The method of claim 18, further comprising:
during the second boosting, applying a program voltage to a word line associated with the second non-volatile storage element.

20. The method of claim 18, wherein:
the programming sequence starts at a source side of the at least one NAND string and ends at a drain side of the at least one NAND string.

21. The method of claim 18, wherein:
the side of the first non-volatile storage element which is before the first non-volatile storage element in the programming sequence includes non-volatile storage elements in the at least one NAND string which are fully programmed; and the side of the second non-volatile storage element which is after the second non-volatile storage element in the programming sequence includes non-volatile storage elements in the at least one NAND string which are unprogrammed and/or partially programmed.

22. The method of claim 18, wherein:
the side of the first non-volatile storage element which is before the first non-volatile storage element in the programming sequence has undergone programming operations, since a last erase operation, needed to fully program a non-volatile storage element; and
the side of the second non-volatile storage element which is after the second non-volatile storage element in the programming sequence has not undergone programming operations, since the last erase operation, needed to fully program a non-volatile storage element.

23. The method of claim 18, further comprising:
during the first boosting, providing at least one non-volatile storage element which is between the first and second non-volatile storage elements in a conducting state, so that every non-volatile storage element in the at least one NAND string between the first and second non-volatile storage element is provided in a conducting state.

24. The method of claim 18, further comprising:
during the first boosting, providing at least one non-volatile storage element which is on the side of the second non-volatile storage element which is after the second non-volatile storage element in the programming sequence in a conducting state, and adjacent to the second non-volatile storage element.

25. The method of claim 18, further comprising:
during the first boosting, avoiding boosting of a set of non-volatile storage elements which is on the side of the second non-volatile storage element which is after the second non-volatile storage element in the programming sequence.

26. A method for operating non-volatile storage, comprising:
(a) in a first time period:
(i) applying voltages to a first set of word lines on a source side of a particular word line in a set of word lines for boosting a first channel region of at least one NAND string;
(ii) applying voltages to a second set of word lines which includes the particular word line, the second set of word lines is on a drain side of the first set of word lines, to provide non-volatile storage elements in the at least one NAND string which are associated with the second set of word lines in a conducting state; and
(iii) applying voltages to a third set of word lines on a drain side of the second set of word lines, to avoiding boosting of a second channel region of the at least one NAND string; and
(b) in a second time period which follows the first time period:
(i) applying voltages to the third set of word lines for boosting the second channel region of the at least one NAND string;
(ii) applying a program voltage to a word line in the second set of word lines; and
(iii) applying a voltage to the particular word line to isolate the first channel region from the second channel region.

27. The method of claim 26, wherein:
the voltages in steps (a)(i) and (b)(i) are the same.

28. The method of claim 26, wherein:
the voltages in step (a)(ii) are lower than the voltages in step (a)(i) but higher than the voltages in step (a)(iii).

29. The method of claim 26, wherein:
the program voltage is greater than the voltages in step (a)(i).

30. The method of claim 26, further comprising:
during the second boosting, applying a voltage to at least one of the word lines of the plurality of word lines which is between the particular word line and the word line to which the program voltage is applied, for boosting the at least one NAND string between the particular word line and the word line to which the program voltage is applied.

31. The method of claim 26, further comprising:
during the second time period, applying voltages to a fourth set of word lines on a drain side of the third set of word lines for boosting a third channel region of the at least one NAND string on a drain side of the second channel region, and applying a voltage to a word line between the second and third channel regions for isolating the second and third channel regions from each other.

32. The method of claim 26, further comprising:
in step (a)(ii) the voltages applied to the second set of word lines are set based on programmed states of the non-volatile storage elements in the at least one NAND string which are associated with the second set of word lines.

33. The method of claim 26, further comprising:
in step (a)(ii) the voltages applied to the second set of word lines include a higher voltage which is applied to a non-volatile storage element with a higher programmed state, and a lower voltage which is applied to a non-volatile storage element with a lower programmed state.

* * * * *